United States Patent [19]

Amada et al.

[11] Patent Number: 5,134,962
[45] Date of Patent: Aug. 4, 1992

[54] SPIN COATING APPARATUS

[75] Inventors: Haruo Amada, Kamisato; Akihiro Kojima; Hiroshi Kagohashi, both of Kasugai; Atsuyuki Sakai; Katsumasa Shimura, both of Nagoya; Hisamitsu Maekawa, Kasugai, all of Japan

[73] Assignees: Hitachi, Ltd., Tokyo; CKD Corporation, Komaki, both of Japan

[21] Appl. No.: 524,378

[22] Filed: May 16, 1990

[30] Foreign Application Priority Data

Sep. 29, 1989 [JP] Japan .................. 1-254796

[51] Int. Cl.⁵ .................. B05C 5/00; B05C 11/02; B05C 11/10
[52] U.S. Cl. .................. 118/688; 118/696; 118/697; 118/712; 118/52; 118/320; 222/571; 222/52; 222/63; 222/71; 222/148; 222/334; 222/146.1; 417/63; 417/395; 239/71; 73/40; 73/40.5 R
[58] Field of Search .............. 118/683, 688, 695, 696, 118/697, 52, 712, 320; 222/571, 52, 63, 71, 148, 334, 146.1; 417/63, 393, 395; 92/103 R, 103 M; 239/71; 73/40, 40.5 R

[56] References Cited

U.S. PATENT DOCUMENTS

| | | | |
|---|---|---|---|
| 3,105,442 | 10/1963 | Howerton | 417/63 |
| 3,176,623 | 4/1965 | Howerton et al. | 417/63 |
| 3,227,314 | 1/1966 | Porter et al. | 417/395 |
| 3,887,110 | 6/1975 | Porter | 222/63 X |
| 3,895,748 | 7/1975 | Klingenberg | 222/571 X |
| 3,937,400 | 2/1976 | Krause | 222/334 X |
| 4,037,598 | 7/1977 | Georgi | 222/71 X |
| 4,137,913 | 2/1979 | Georgi | 222/63 X |
| 4,523,901 | 6/1985 | Schippers et al. | 417/395 |
| 4,597,719 | 7/1986 | Tano | 222/571 X |
| 4,690,621 | 9/1987 | Swain | 417/313 |
| 4,740,139 | 4/1988 | Mantell | 417/395 X |
| 5,006,067 | 4/1991 | Pignattini | 222/571 X |

FOREIGN PATENT DOCUMENTS

| | | | |
|---|---|---|---|
| 265748 | 5/1988 | European Pat. Off. | 118/688 |
| 54-48160 | 4/1979 | Japan . | |
| 56-30630 | 3/1981 | Japan | 118/712 |
| 57-177365 | 11/1982 | Japan . | |
| 55-108741 | 8/1986 | Japan | 118/52 |
| 62-11920 | 9/1987 | Japan . | |
| 62-214621 | 9/1987 | Japan | 118/52 |
| 62-221463 | 9/1987 | Japan . | |
| 63-76327 | 4/1988 | Japan . | |
| 64-8621 | 1/1989 | Japan . | |
| 64-21924 | 1/1989 | Japan . | |

Primary Examiner—W. Gary Jones
Assistant Examiner—Todd J. Burns
Attorney, Agent, or Firm—Antonelli, Terry, Stout & Kraus

[57] ABSTRACT

The present invention relates to a spin coating apparatus for feeding a clean liquid at a fixed rate. In any of the feeding apparatus in the prior art, no constituent other than a filter has the function of eliminating foreign matter, and the operation of feeding a liquid under precise control is not attained. This results in the problem of the mixing of the foreign matter (and air bubbles) in the feed liquid, and the problem of nonuniformity in a feed speed as well as a feed amount. As expedients for solving these problems, the present invention provides the functions of automatically sensing and excluding factors for the appearances of the foreign matters, and devices for automatically and precisely controlling feed control elements such as a pump, thereby feeding the clean liquid in a constant amount and at a constant speed.

23 Claims, 12 Drawing Sheets

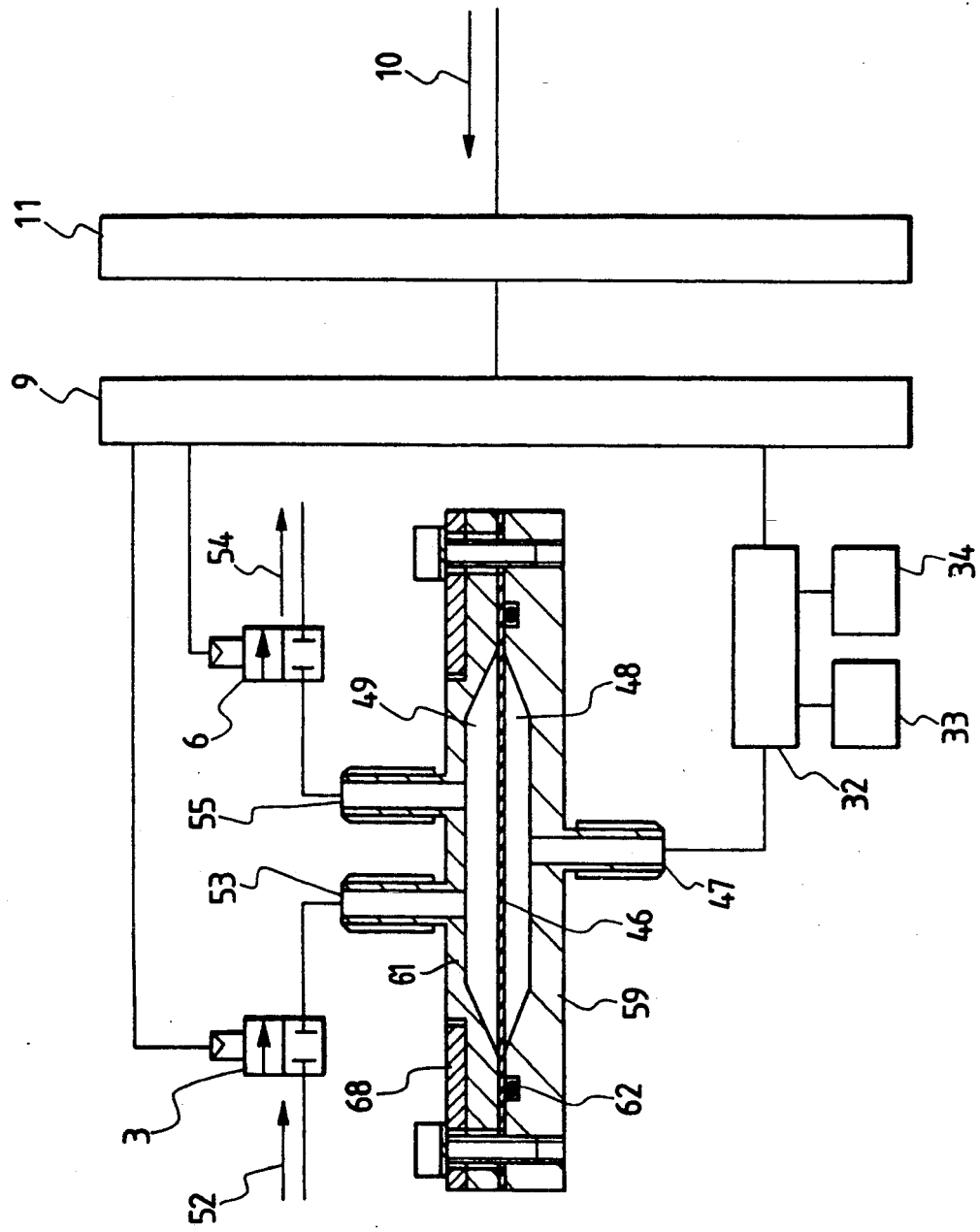

SPIN COATING APPARATUS

BACKGROUND OF THE INVENTION

The present invention relates to spin coating technology and fluid feeding technology. More particularly, it is effective when utilized for spin coating techniques and liquid feeding techniques in the manufacture of semiconductors, magnetic disks, multilayer wiring circuit boards, chemicals, foods, etc.

The present invention is applied especially to a liquid feeding apparatus which feeds liquids at predetermined rates in highly pure states and under precise speed controls.

In the manufacturing processes of the semiconductor industry, the magnetic disk industry, etc., there are often used chemical processes which employ liquids such as pure water, acids, alkalis, organic solvents and photoresists.

As regards the semiconductor manufacturing processes, the dimension of finishing which is required for production based on the treatment processes employing liquid chemicals has been reduced from 0.8 $\mu$m to 0.5 $\mu$m, and defective shapes as well as defective characteristics which are ascribable to the mixing of impurities such as air bubbles and foreign matter have occurred frequently. This situation has necessitated a technique which eliminates the impurities in the chemical liquid, such as air bubbles and foreign matter, and then feeds the liquid in a clean state.

Moreover, it is common in these fields to switchingly handle various liquids which differ in physical properties, such as viscosities and specific gravities, thus producing fluctuations of liquid feed characteristics.

Under these circumstances, several liquid feeding apparatus have been proposed as prior-art techniques.

First, as an expedient for avoiding the mixing of air bubbles (gas bubbles) in a feed liquid, a method wherein the bubbles are trapped in the filter of a chemical liquid feed section and are removed by a branch pipe is known from the official gazette of Japanese Patent Application Laid-open No. 211920/1987.

Also, as an expedient for avoiding the mixing of foreign matter in a feed liquid, a method wherein a filter, a pump and a control valve are united to prevent the liquid from staying within a liquid feed system and to remove the foreign matter by means of the filter is known from the official gazette of Japanese Patent Application Laid-open No. 500135/1989.

Also, as an expedient for preventing drippings and feed rate fluctuations which are ascribable to the fluctuations of a suck-back rate within a dropping nozzle, a method wherein the suck-back rate within the dropping nozzle is optically measured and is controlled is known from the official gazette of Japanese Patent Application Laid-open No. 21924/1989.

Further, as an expedient for preventing the fluctuations of a liquid feed rate and a suck-back rate, a method wherein the ON/OFF timings of valves for compressing and decompressing a liquid container and a valve for feeding a liquid are independently controlled is disclosed in the official gazette of Japanese Patent Application Laid-open No. 76327/1988.

Also, as an expedient for feeding at a fixed rate a liquid whose viscosity changes with time, a method wherein a period of time for feeding the liquid is automatically set by a timer with the lapse of time is known from the official gazette of Japanese Patent Application Laid-open No. 221463/1987.

In addition, as an expedient for preventing matter from adhering to a dropping nozzle, a method wherein the dropping nozzle is immersed in a detergent liquid during the cessation of liquid feed, whereby a feed liquid remaining in the dropping nozzle is prevented from drying and solidifying, is known from the official gazette of Japanese Patent Application Laid-open No. 8621/1989.

BRIEF SUMMARY OF THE INVENTION

It has been revealed by the inventor that, although the prior-art techniques mentioned above are somewhat effective for the short term, they are imperfect for the long term, and that none of them can completely eliminate impurities, such as air bubbles and foreign matter, contained in a feed liquid and cannot feed (and suck back) the feed liquid at an accurate predetermined rate in a high purity state and with the precise control of feed speed (and a suck-up speed).

More specifically, with the intra-liquid bubble removing expedient described in the official gazette of Japanese Patent Application Laid-open No. 211920/1987, the feed liquid is discharged through the bubble discharging branch pipe together with the air bubbles. As a result, the pipe becomes clogged due to the discharged liquid, and the efficiency of removal of the air bubbles lowers.

Another problem is that the efficiency of removal of the air bubbles lowers unless the valve opening area of the bubble discharging branch pipe is adjusted according to the viscosity of the feed liquid and the degree of appearance of the air bubbles.

Next, with the liquid feed expedient described in Japanese Patent Application Laid-open No. 500135/1989, in a case where various liquids differing in physical properties such as viscosities and specific gravities are switchingly used and are fed at fixed rates, a pump pressure and a valve opening time interval must be set at the optimum values for each of the liquids having the different physical properties.

It has also been found that the fluctuations of a suck-back rate is great in this system.

In particular, the feed rate of the liquid is synergistically determined, not only by the viscosity of the liquid, the pump pressure and the valve opening time interval, but also by a filter pressure loss, etc., which fluctuate according to the situation of use. The operation of actually measuring the feed rate and repeating corrections is inevitable for the adjustments of the pump pressure and the valve opening time interval, so that the system is inefficient.

Moreover, a problem has been found in that adjustment deviation magnitudes become large due to the large number of adjustment parameters, while at the same time, the factors fluctuating with time, such as the filter pressure loss, are involved, so the accuracy of reproducing the feed rate degrades. This problem is common to the technique described in the official gazette of Japanese Patent Application Laid-open No. 221463/1987.

It has also been revealed by the inventors that, regarding the efficiency of the removal of foreign matter by the filter, especially gelatinous foreign matter, foreign matter is transmitted through a filter membrane by liquid pressure acting on the filter.

As a result, the liquid pressure acting on the filter must be controlled to a predetermined optimum value for the purpose of heightening the efficiency of removal of the foreign matter by the filter.

In addition, the function of controlling a liquid feed speed is not included in the liquid feeding apparatus described in each of the official gazettes of Japanese Patent Applications Laid-open Nos. 500135/1989, 221463/1987 and 76327/1988. Meanwhile, it has been found out by the inventor that, in the photoresist spin-coating apparatus of semiconductor manufacturing equipment, there is a correlation between the accuracy of the thickness of a photoresist film formed on a semiconductor wafer and the dropping speed (feed speed) of a photoresist solution.

The inventors' experiment has revealed that a dropping speed (feed speed) of 0.5-1 (cc/sec) is the most suitable for an employed photoresist solution whose viscosity is 20-50 (cp). In order to attain a favorable coating result, accordingly, the liquid feed speed needs to be controlled.

The suck-back rate control system described in each of the official gazettes of Japanese Patent Applications Laid-open Nos. 21924/1989 and 76327/1988 includes the function of controlling the suck-back rate, but it does not include the function of controlling a suck-back speed.

Meanwhile, it has been clarified by the inventor that the mechanism of dripping which arises during a suck-back operation has a causal relation with the suck-back speed.

FIGS. 13(A) and 13(B) elucidate the mechanism of dripping. A silicone oil 108 in FIG. 13(A) had a viscosity of 10 (cp), while a silicone oil 109 in FIG. 13(B) had a viscosity of 50 (cp). Both the oils were sucked back the identical amount of 10 (mm) at the same suck-back speed of 0.012 (cc/sec) by the use of dropping nozzles 8 of fluoroplastics each having an inner diameter of 2 (mm). In the case of the silicone oil 109 of 50 (cp) shown in FIG. 13(B), it has been observed that a silicone oil film 110 is formed on the inner wall of the nozzle 8 in the suck-back operation and that it separates and falls into a drip 111 on account of its own weight with the lapse of time.

The mechanism of dripping is based on the difference of the adsorption energies of the silicone oils with respect to the nozzle inner walls. In the experiment of FIGS. 13(A) and 13(B), the adsorption energy of the 50 (cp) silicone oil is greater than that of the 10 (cp) silicone oil, and part of the 50 (cp) silicone oil in the vicinity of the nozzle inner wall cannot follow up the suck-back mainstream and then remains during the suck-back operation.

In view of the mechanism of dripping, the inventor has found out that, in order to prevent dripping from the dropping nozzle, the suck-back speed must be precisely controlled according to the physical properties of the feed liquid, such as the viscosity and specific gravity thereof and the adsorption energy thereof with respect to the nozzle.

As mentioned before, the method disclosed in Japanese Patent Application Laid-open No. 8621/1989 consists in the expedient for preventing matter from adhering to a dropping nozzle. It has been found by the inventor that the method is effective for a short term, but that it is problematic for a long term.

Concretely the feed liquid and the foreign matter having entered rugged portions of several $\mu$m formed in the inner and outer walls of the nozzle are not removed, and they grow up as the foreign matter adhering to the dropping nozzle.

Further, as an expedient which removes a feed liquid adhering to a dropping nozzle, there is a method as shown in FIG. 14 wherein the dropping nozzle 8 is immersed and held in a detergent liquid 112. In this case, it has been clarified that, unless the feed liquid 113 within the dropping nozzle 8 is precisely sucked back to separate a feed liquid level and a detergent liquid level inside the dropping nozzle 8 by means of a gas layer 114, the feed liquid 113 dissolves into the detergent liquid 112 in a vessel 115 and contaminates it, resulting in the contamination of the dropping nozzle 8.

In addition to the foregoing, the following problems common to liquid feeding apparatus have been found by the inventor on the basis of the results of the analyses of factors which hinder the constant-amount and constant-speed feed of a photoresist by a photoresist feeding apparatus: (1) In order to precisely supply a liquid at a constant speed and in a constant amount, the constituent elements of a liquid feeding apparatus must be controlled in integrated fashion, according to the physical properties of the feed liquid, such as viscosity, and the pressure loss of feed piping.

Concretely, it has been revealed that the suction and discharge pressure values of a pump and a suck-back valve and the ON/OFF times of a feed control valve are controlled in integrated fashion, whereby a feed rate (feed speed) and a suck-back rate (suck-back speed) can be precisely controlled. (2) In order to supply a liquid in a state of high purity, those factors of the constituent elements of a liquid feeding apparatus which generate foreign matter must be managed and controlled in integrated fashion.

Concretely, it has been revealed that the liquid can be supplied in the highly pure state by the integrated control of the following: <1> prevention of the mixing of air bubbles into a pipe as based on the management of a liquid reserve in a container; <2> prevention of the appearance of air bubbles as based on the control of the speed of the suction (negative pressure) operation of a pump actuating valve; <3> prevention of dripping as based on the control of the suction (negative pressure) operation of a suck-back valve; <4> prevention of the appearance of foreign matter as based on the management of damage to the pump actuating valve, the suck-back valve and a control valve; <5> prevention of the transmission of gelatinous foreign matter as based on the management of a liquid pressure acting on a filter membrane; <6> prevention of defective filtering as based on the management of damage to the filter membrane; and <7> removal of air bubbles as based on the detection of air bubbles mixed in a liquid.

In view of the foregoing, an object of the present invention is to provide, as a liquid feeding expedient, a technique according to which a liquid of high purity free from impurities such as air bubbles and foreign matter is supplied accurately in a predetermined amount under a precise control at a predetermined speed.

An object of the present invention is to provide the viscous liquid dispenser of a treatment device for a photoresist or the like as based on a computer control in which treatment conditions can be set by external key inputting or by the transfers of signals.

Another object of the present invention is to provide a control technique which permits a constant-speed operation of high accuracy and which is effective for a discharge pump of a dispenser for a photoresist or the like.

Still another object of the present invention is to provide a simple and accurate technique for automatically measuring the viscosity of a liquid to be handled in coating with a photoresist or the like.

Another object of the present invention is to provide a photoresist dropping technique for semiconductor manufacture, of the central management type having a central control device which synthetically manages the status and monitors data items of various units.

Another object of the present invention is to provide a technique for dropping a photoresist or the like with little foreign matter.

Still another object of the present invention is to provide such a technique for dropping a photoresist or the like in which a central control device can calculate and set the optimum conditions on the basis of initial input data.

Yet another object of the present invention is to exclude the appearance of gelatinous foreign matter attributed to the staying of a liquid, in such a way that an automatic management function for a filter pressure loss value and a removal function for air bubbles trapped in a filter are utilized, that a pump, a discharge switching valve and a suck-back valve are provided on this side of the filter, and that the amount of the liquid to stay behind the filter is set to be smaller than the amount of discharge in a previous discharge disposal.

A further object of the present invention is to supply a feed liquid in a constant amount and at a constant speed under the precise temperature control of the feed liquid in such a way that, among the constituent elements of a liquid feeding apparatus, a filter which stores the liquid in a large amount has its temperature controlled.

Typical aspects of performance of the present invention are briefly summarized as follows:

A spin coating apparatus according to the present invention comprises dispenser means having a diaphragm pump for sucking a coating liquid from a liquid source and for discharging and dropping the sucked liquid in a constant amount and at a constant speed from a discharge nozzle onto a flat object placed on a rotary stage; and a dispenser central control device including a microcomputer or minicomputer for controlling the diaphragm pump.

In addition, another spin coating apparatus according to the present invention comprises dispenser means having suck-back means including a diaphragm pump by which, in sucking a coating liquid from a liquid source and then dropping the coating liquid from a discharge nozzle onto a flat object placed on a rotary stage, the coating liquid within the discharge nozzle is sucked inwardly of the nozzle in a constant amount and at a constant speed after each preceding drop in order to prevent any undesirable drop; and a dispenser central control device including a microcomputer or minicomputer for controlling the suck-back means.

Further, in a fluid feeding apparatus according to the present invention, as an expedient for precisely controlling the feed speed and feed amount of a fluid or liquid, the operations of the constituent elements of the apparatus ar controlled while control parameter values such as the working pressures and operation timings of control valves are being automatically set in accordance with control input information items, e. g., physical properties and feed conditions such as the pressure loss of a feed system and the viscosity of the liquid.

As another expedient for enhancing the accuracies of the liquid feed speed and feed amount, there is incorporated the function of automatically evaluating the pressure loss of a feed system and the viscosity of a liquid from a liquid feed pressure value and a liquid feed speed value and then automatically correcting the control parameters.

As an expedient for feeding a fluid or liquid of good purity without mixing impurities such as foreign matter and air bubbles therein, the constituent elements of a liquid feeding apparatus ar furnished with the functions of sensing factors for the appearances of the impurities such as foreign matter and air bubbles and are controlled in integrated fashion in accordance with the sensed information, thereby automatically excluding the factors of the appearances of the impurities.

Concretely, a dropping nozzle, a suck-back nozzle, switching valves, etc., which are the constituent elements of the liquid feeding apparatus, are interconnected, and these control valves, etc., are connected to a pneumatic control valve assembly which includes an electro-pneumatic servo control valve.

The pneumatic control valve assembly is connected to a general control device which actuates the pneumatic control valve assembly in accordance with input information items on the constant-amount feed of the liquid, such as a viscosity, a feed speed and a feed amount.

The constituent elements of the liquid feeding apparatus are equipped with monitors which detect the factors of the appearance of the impurities such as air bubbles and foreign matter, and which are connected to the general control section. This general control section controls the constituent elements of the liquid feeding apparatus in accordance with the detected monitor information items on the factors of the appearances of the impurities, so as to exclude the factors of the appearances of the impurities, and it delivers information on any abnormal operation.

The impurity appearance factor monitors include, for example, (1) a monitor for a liquid reserve in a container, (2) a monitor for the damage of a pump actuating valve, (3) a monitor for the damage of the suck-back valve, (4) a monitor for the damage of the switching valve, (5) a monitor for the damage of a filter membrane, (6) a monitor for a liquid pressure on the filter membrane, (7) a monitor for sensing the air bubbles in a feed system, and (8) a monitor for the contamination degree of the dropping nozzle.

An expedient for enhancing the control accuracy and control responsibility of liquid feed consists in a structure in which suction and discharge amounts are controlled using a diaphragm. The control of a liquid feed amount (feed speed) is based on a system in which a pressure on the diaphragm and the ON/OFF times of switching valves are controlled to the optima by a general control section.

Another expedient for enhancing the control accuracy of liquid feed consists in a system in which the movement magnitude of the diaphragm is measured in a noncontacting manner, and the measured information is fed back to the general control section so as to precisely control the movement magnitude (movement speed) of the diaphragm, thereby controlling the speed and amount of the liquid feed.

As an alternative expedient for enhancing the control accuracy of liquid feed, switching valves which are independently controllable are arranged at the inlet and outlet of a feed pump in a manner to be separated from a pump proper.

As an expedient for preventing the mixing of any impurity ascribable to the chemical reaction between a liquid and a member which comes into contact with the liquid during the feed thereof, such a member is made of fluoroplastics, for example, Teflon (trademark of Dupont) which is a material stable against chemicals.

According to the expedients thus far described, input information items on the constant-amount feed of a fluid or liquid, such as a viscosity, a feed speed and a feed amount, are given to the general control section, whereupon the general control section automatically calculates and obtains a diaphragm pressure on the basis of a liquid feed speed (=feed amount/feed time), using the following formula of diaphragm pressure characteristics evaluated from a viscosity parameter and feed system pressure loss parameters:

$P = f(q, \eta, \alpha)$

P; diaphragm pressure
q; feed speed (=feed amount/feed time)
$\eta$; viscosity
$\alpha$; feed system pressure losses (filter pressure loss, piping pressure loss).

While the diaphragm pressure obtained is held constant, the discharge switching valve is opened for the feed time, whereby the liquid of predetermined amount can be automatically and precisely supplied at a predetermined speed value.

Alternatively, the diaphragm movement speed value (movement magnitude) stated before is measured in a noncontacting manner, and the measured information is fed back to the general control section. In the general control section, the diaphragm pressure value is automatically corrected and controlled so as to establish a diaphragm movement speed value (movement magnitude) corresponding to the aforementioned feed speed value (feed amount), so that the accuracy of the liquid feed speed (feed amount) can be heightened.

The general control section ca manage the liquid reserved in a container, by means of a liquid reserve monitor, and it cuts off the liquid feed in case of a deficient liquid reserve, so that air bubbles can be prevented from mixing in the feed system due to a deficient liquid reserve.

As in the above operation of the liquid feed, a diaphragm suction speed during the suction of the liquid is controlled, whereby air bubbles appearing in the liquid suction operation can be controlled to a minimum. At worst, the air bubbles having appeared can be detected by an air bubble detecting monitor, and only the air bubbles can be emitted by a switching valve which is independently controllable.

The general control section automatically manages the damages of actuating valves, the damage of a filter membrane and the contamination degree of a dropping nozzle, which are the factors of the appearance of foreign matter in the constituent elements of a liquid feeding apparatus, and it cuts off the liquid feed in case of any abnormality, thereby preventing the foreign matter from mixing in the feed liquid.

The general control section can control the diaphragm pressure to the predetermined value and can therefore control a liquid pressure acting on the filter membrane, so as not to exceed a predetermined value, whereby gelatinous foreign matter can be prevented from permeating the filter membrane.

Since, as stated before, the diaphragm movement speed value (movement magnitude) can be controlled with high precision, the speed of suck-back at the dropping nozzle which is connected to a suck-back valve including a diaphragm actuating valve can be controlled to a constant speed, and the liquid can be precisely sucked back in a constant amount, so that the dripping of the liquid and the contamination of the dropping nozzle attributed to defective suck-back operations can be prevented.

Although, in the following description of embodiments, several examples divided as being independent will be referred to for the sake of convenience, it should be noticed that the individual examples are not actually independent, but that one of them can form part or a modification of another or some steps of another. For example, sequences and inputs correspond to all the examples unless especially contradictory, and hence, they shall not be explained over and over again. Further, matters which hold true of a discharge pump apply to a suck-back pump similarly and shall not be repeatedly stated, but they shall comprehend both pumps unless otherwise specified. In addition, unless otherwise specified, components indicated by reference numerals the lower two digits of which are the same have similar purposes, operations and structures.

BRIEF DESCRIPTION OF THE DRAWINGS

FIG. 5 is a view, partly in section, of the essential portions of a pump for automatically controlling a pressure on a diaphragm;

DETAILED DESCRIPTION OF THE INVENTION

Figure 1:
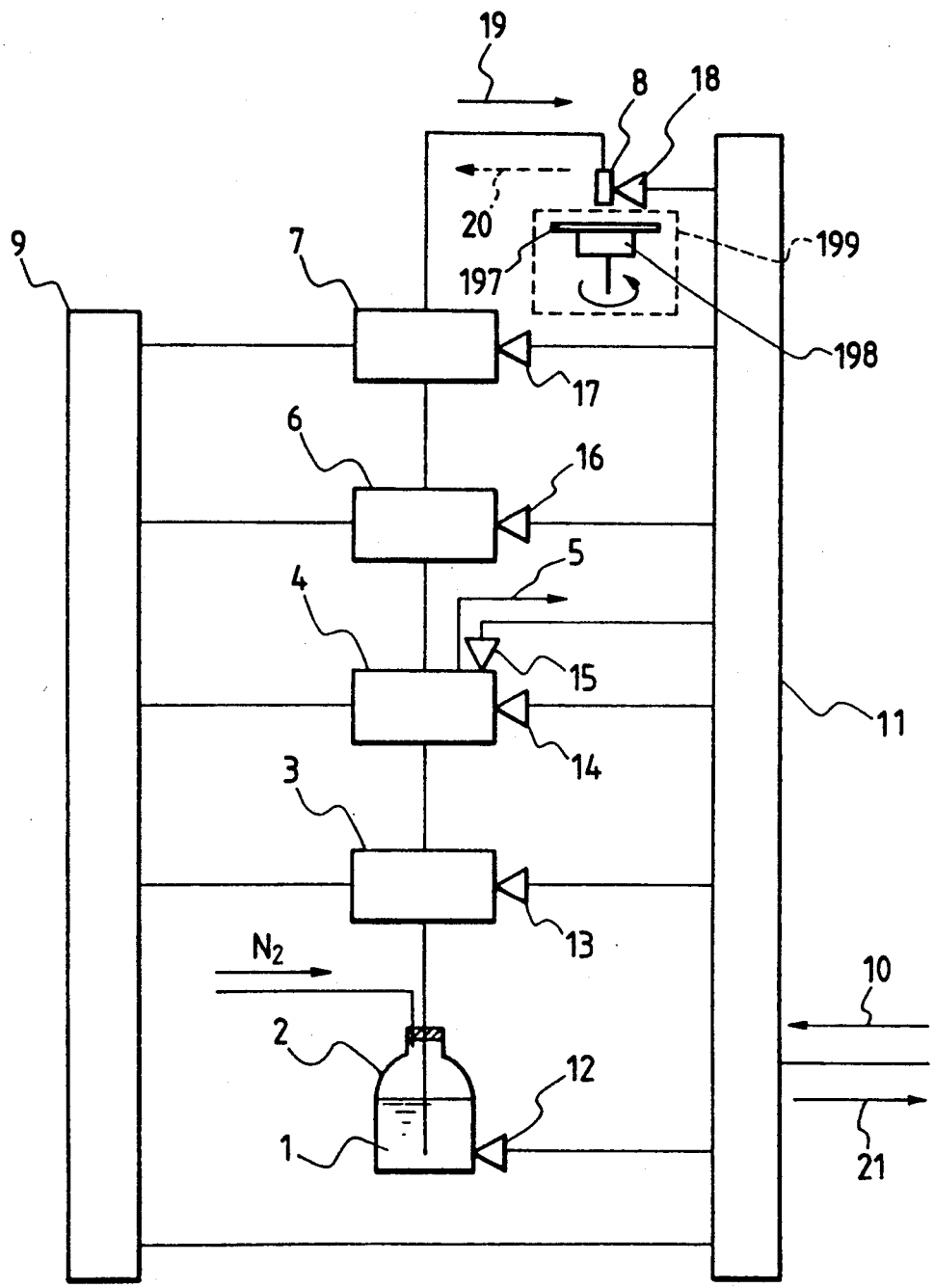
FIG. 1 is a system diagram of a chemical liquid feeding apparatus which is an embodiment of the present invention.

FIG. 1 shows a system diagram of a chemical liquid feeding apparatus which is one embodiment of the present invention.

In the construction of this embodiment, there are interconnected a chemical liquid container 2 containing a chemical liquid 1, a suction switching valve (chemical liquid suction valve) 3, a chemical liquid transfer pump 4 including a diaphragm pump, an air bubble vent 5, a discharge switching valve (chemical liquid discharge valve) 6, a suck-back valve 7 including a diaphragm pump, and a dropping nozzle 8. The control valves, etc. 3–7 are connected to a pneumatic pressure control device (pneumatic controller) 9 including an electro-pneumatic servo proportional valve. The pneumatic pressure control device 9 is connected to a liquid-feed general-control device (central control device) 11 which controls the pneumatic pressure control device 9 in interlocking with items of input information 10 on the constant-amount an constant-speed supply of the chemical liquid 1, such as the viscosity, feed amount-and feed speed of the chemical liquid 1.

The liquid-feed general-control device 11 is furnished with abnormality management functions for managing factors for the appearance of foreign matter and factors for fluctuations in the constant-amount and constant-speed supply. The functions are attained by connecting a liquid reserve sensing monitor 12 which senses the reserve of the chemical liquid 1 in the chemical liquid container 2, a suction switching valve damage monitor 13 which senses damage of the suction switching valve 3, a diaphragm damage monitor 14 which senses damage of the diaphragm of the diaphragm pump 4, an air bubble sensing monitor 15 which senses air bubbles appearing in the diaphragm pump 4 and which vents the air bubbles in the diaphragm pump 4, a discharge switching valve damage monitor 16 which sense damage of the discharge switching valve 6, a suck-back valve damage monitor 17 which senses the damage of the suck-back valve 7, and a dropping nozzle contamination sensing monitor 18 which senses the degree of contamination of the dropping nozzle 8. These monitors 12–18 sense items of information on the abnormal operations of the corresponding control constituents, and the general control device 11 manages the information items.

Further, the liquid-feed general-control device 11 controls the operations of the control constituents such as pumps, suck-back valve and switching valves through the pneumatic pressure control device 9, so as to discharge the chemical liquid 1 in a constant amount and at a constant speed (as indicated at numeral 19) and to suck it back in a constant amount and at a constant speed (as indicated at numeral 20).

The liquid-feed general-control device 11 manages and controls the operating states of these control constituents and also manages the states concerning the aforementioned abnormal operations, and it delivers the information items as output information items 21.

In addition, numeral 197 indicates an 8-inch semiconductor wafer (of Si) on which a semiconductor integrated circuit, for example, 16 M.DRAM is to be formed, and numeral 198 a high speed turntable which is controlled by a spin-coater central control computer included in a photoresist treatment device 199.

Now, the operation of this system will be described. The viscosity, discharge amount, discharge speed value, suck-back amount and suck-back speed value of the chemical liquid 1 are set in the liquid-feed general-control device 11 as the input information items 10 for the constant-amount and constant-speed supply of the chemical liquid 1. Then, the liquid-feed general-control device 11 automatically determines the optimum solutions of the working pressure values of the diaphragm pump 4 and suck-back valve 7 and the operating sequence controls of the suction switching valve 3 and discharge switching valve 6, and it optimally controls the control elements through the pneumatic pressure control device 9, so as to discharge the chemical liquid 1 in the constant amount and at the constant speed and to suck it back in the constant amount and at the constant speed.

Further, the liquid-feed general-control device 11 senses the several valve damages, the air bubbles and the dropping nozzle contamination which form the factors for the appearance of foreign matter and the factors for the fluctuation of the constant-amount and constant-speed supply. In the presence of any abnormality, the control device 11 automatically excludes the factor of the abnormality without dropping the chemical liquid 1.

By way of example, the control device 11 is endowed with the function of automatically excluding the air bubbles through the air bubble vent 5 when they have been sensed by the air bubble sensing monitor 15, and the function of automatically deterging the dropping nozzle 8 or automatically exchanging it when the contamination of the dropping nozzle 8 has been sensed by the dropping nozzle contamination sensing monitor 18, whereby the contamination degree of the dropping nozzle 8 is automatically controlled to a predetermined level or below.

Further, as an expedient which prevents air bubbles from mixing into the feed system because of the deficiency of the reserve of the chemical liquid 1 in the container 2, the liquid level of the chemical liquid 1 in the container 2 is sensed by the reserve sensing monitor 12, and the chemical liquid 1 is automatically resupplied when the liquid level drops below a predetermined level.

In addition, the damage of any of the several control valves is automatically sensed by the valve damage sensing monitor so as to automatically change-over the feed system of the chemical liquid 1 to another bypass line.

Due to these automatic processes, the chemical liquid 1 is precisely controlled into a clean state at all times, and it is discharged in a constant amount and at a constant speed and is also sucked back in a constant amount and at a constant speed.

Figure 2:
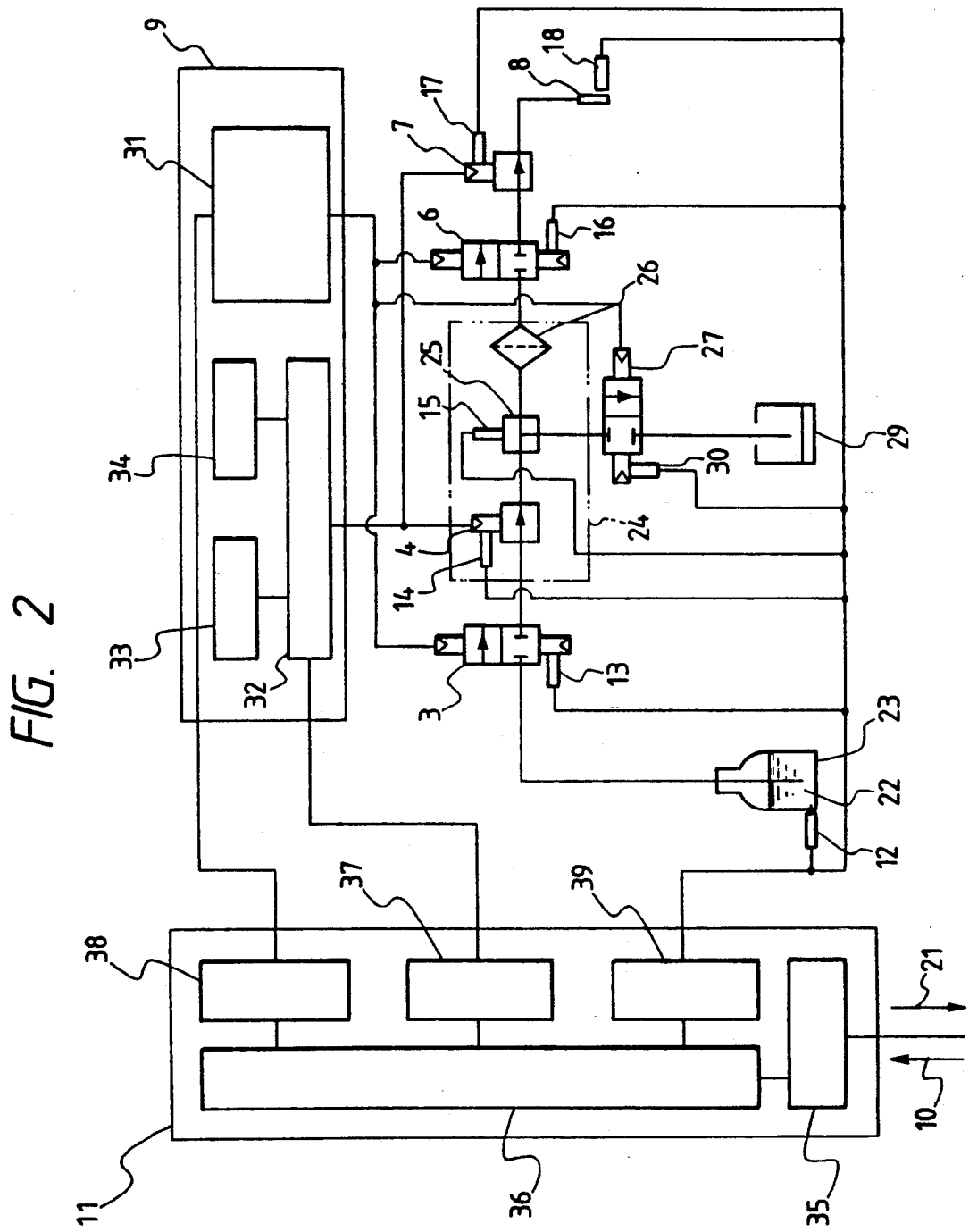
FIG. 2 is an arrangement diagram of a photoresist solution feeding apparatus.

FIG. 2 shows an arrangement diagram of a photoresist solution feeding apparatus. In the arrangement of this apparatus, there are interconnected a photoresist solution container 23 containing a photoresist solution 22, a suction switching valve 3, a diaphragm pump 24 having a built-in filter, a discharge switching valve 6, a suck-back valve 7, and a dropping nozzle 8.

The diaphragm pump 24 having the built-in filter includes a diaphragm pump 4, an air bubble trap 25 and the filter 26. The air bubble trap 25 has an air bubble sensing monitor 15 mounted thereon, and it has an air bubble vent switching valve (air vent valve) 27 and a waste solution tank 29 connected thereto.

Meanwhile, in order to attain the functions of sensing factors for the appearance of foreign matter and factors for fluctuation in a constant amount and constant-speed supply, there are disposed besides the air bubble sensing monitor 15 mentioned above, a monitor 12 for sensing a reserve in the photoresist solution container 23, and valve damage sensing monitors for sensing damage of the several actuating valves, namely, a suction switching valve damage monitor 13, a diaphragm damage monitor 14, an air bubble vent switching valve damage monitor 30 and a suck-back valve damage monitor 17. Also, a dropping nozzle contamination sensing monitor 18 is provided for sensing the degree of contamination of the dropping nozzle 8.

The control constituents described above are connected to a pneumatic pressure control device 9 and a liquid-feed general-control device 11. The pneumatic pressure control device 9 includes a pneumatic drive control valve 31 which controls the operations of the suction switching valve 3, discharge switching valve 6 and air bubble vent switching valve 27; an electro-pneumatic servo proportional valve 32 which controls the working pressures of the diaphragm pump 4 and suck-back valve 7; a compressed air generator 33; and a vacuum generator 34.

The liquid-feed general-control device 11 includes a data input/output control unit 35 which receives input information 10 and delivers output information 21 for supplying the photoresist solution 22 in a constant amount and at a constant speed under a clean state; a central processing unit 36 which determines the optimum pressure values of the diaphragm pump 4 and suck-back valve 7 and the optimum operation timings of the several switching valves in accordance with the input information items 10; a diaphragm pressure control unit 37 which controls the electro-pneumatic servo proportional valve 32 in accordance with the diaphragm pressure control information of the diaphragm pump 4 as determined by the central processing unit 36; a 5 valve drive control unit 38 which controls the pneumatic drive control valve 31 in accordance with the operation timing control information items of the several switching valves; and an abnormality management signal processing unit 39 which processes 10 the abnormality management signals of the several actuating valve damage monitors, reserve sensing monitor 12, etc. for sensing the factors of the appearance of foreign matter and the factors of the fluctuation of the constant-amount and 15 constant-speed supply as described before.

Figure 3:
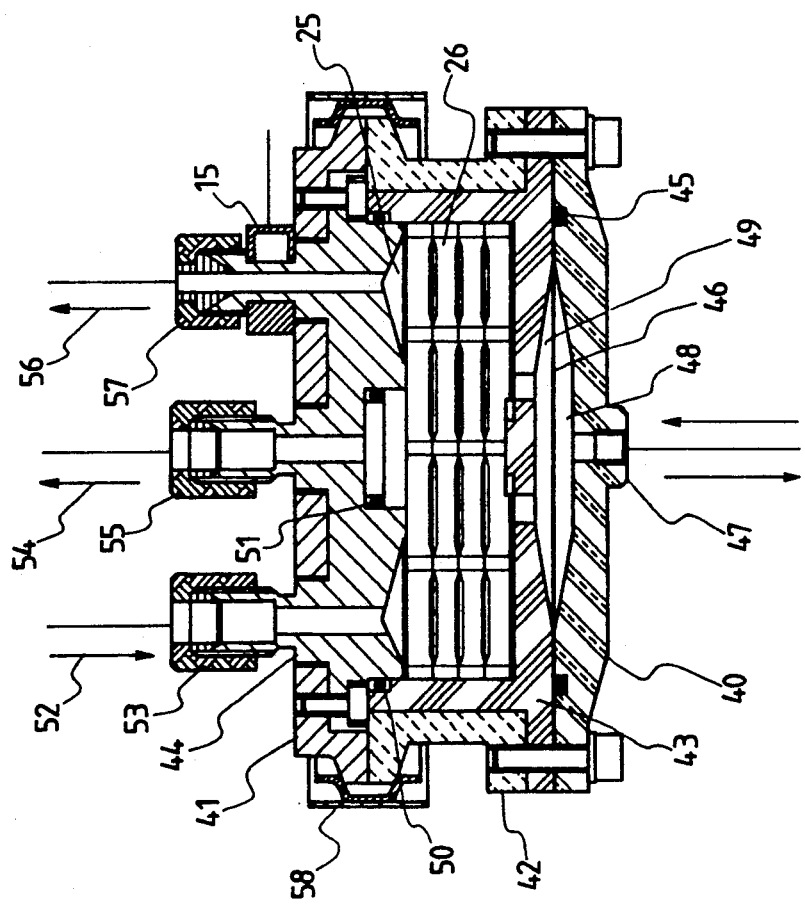
FIG. 3 is a sectional view of the essential portions of a diaphragm pump having a built-in filter.

FIG. 3 shows a sectional view of the essential portions of the diaphragm pump having the built-in filter. In the construction of the diaphragm pump, a pump body includes bodies 40, 41 and 42 made of metal such as stainless steel, and bodies 43 and 44 made of fluoroplastics.

A diaphragm 46 made of fluoroplastics is set by the bodies 40 and 43 and through an O-ring 45.

The body 40 is provided with a suction/discharge amount controlling air circulation port 47 for pneumatically controlling the displacement of the diaphragm 46.

Further, the body 40 and the diaphragm 46 define a diaphragm displacement magnitude controlling chamber 48, while the diaphragm 46 and the body 43 define a liquid pressure feed chamber 49.

As an expedient for pneumatically controlling the displacement magnitude of the diaphragm 46 and sucking/discharging a liquid in a constant amount and at a constant speed through the liquid feed pressure chamber 49, compressed air or negative pressure air (vacuum) controlled by the electro-pneumatic servo proportional valve 32 is caused to act on the diaphragm displacement magnitude controlling chamber 48. Thus, the diaphragm 46 is displaced a predetermined magnitude, thereby to suck the liquid into the liquid pressure feed chamber 49 in a constant amount and at a constant speed and to discharge the liquid from the liquid pressure feed chamber 49 in a constant amount and at a constant speed.

The filter 26 made of fluoroplastics is set inside the body 43. The bodies 43 and 44 are sealed by an O-ring 50, while the filter 26 and the body 44 are sealed by an O-ring 51. For the purpose of preventing fluctuations in the fitting positional relationships between the body 43 and the body 44 and between the body 44 and the filter 26, the respective O-rings 50 and 51 are installed such that they are deformed by the side surfaces of the bodies.

The body 44 is provided with a suction port 53 which imbibes a suction liquid 52 based on the negative pressure displacement of the diaphragm 46, and a discharge port 55 which spews a discharge liquid 54 based on the compression displacement of the diaphragm 46.

The diaphragm pump further includes the air bubble trap portion 25 which traps air bubbles trapped in the filter 26, the air bubble sensing monitor 15 which senses the air bubbles 56 trapped in the air bubble trap portion 25, and an air bubble vent portion 57 which vents the trapped air bubbles 56.

In addition, the bodies 40, 43 and 42 and the bodies 44 and 41 ar respectively fixed by bolting.

Figure 4:
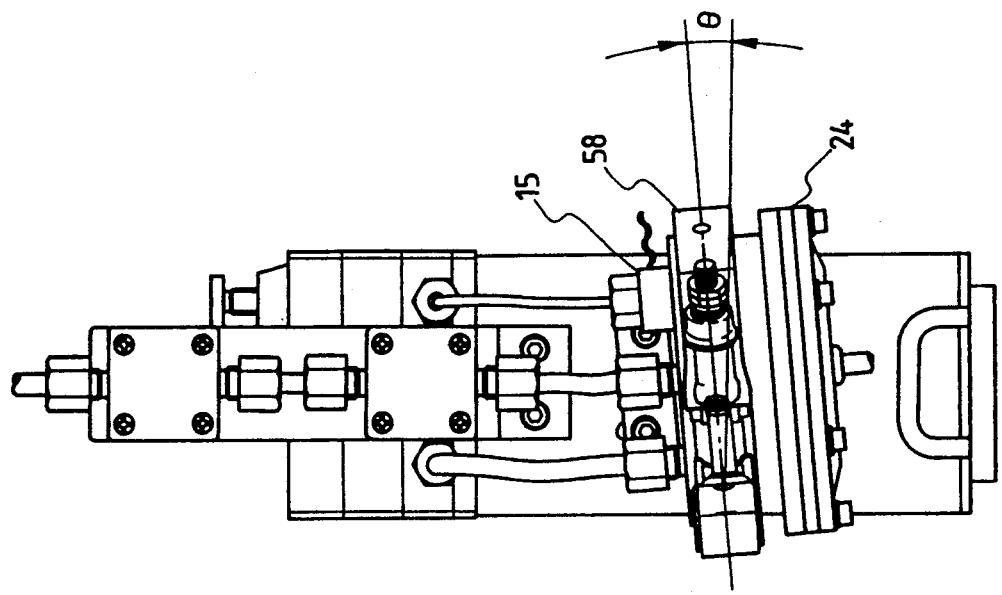
FIG. 4 is a view of the installation of the diaphragm pump having the built-in filter.

FIG. 4 shows the installation view of the diaphragm pump having the built-in filter. The bodies 41 and 42 are mounted on each other by a coupling 58 which can be attached and detached at a touch.

Further, the diaphragm pump 24 having the built-in filter is inclined $\Theta(°)$ so as to locate the air bubble trap portion 25 at the highest position, whereby the air bubbles 56 can be reliably trapped in the air bubble trap portion 25, and the trapped air bubbles 56 can be reliably sensed by the air bubble sensing monitor 15.

Figure 6:
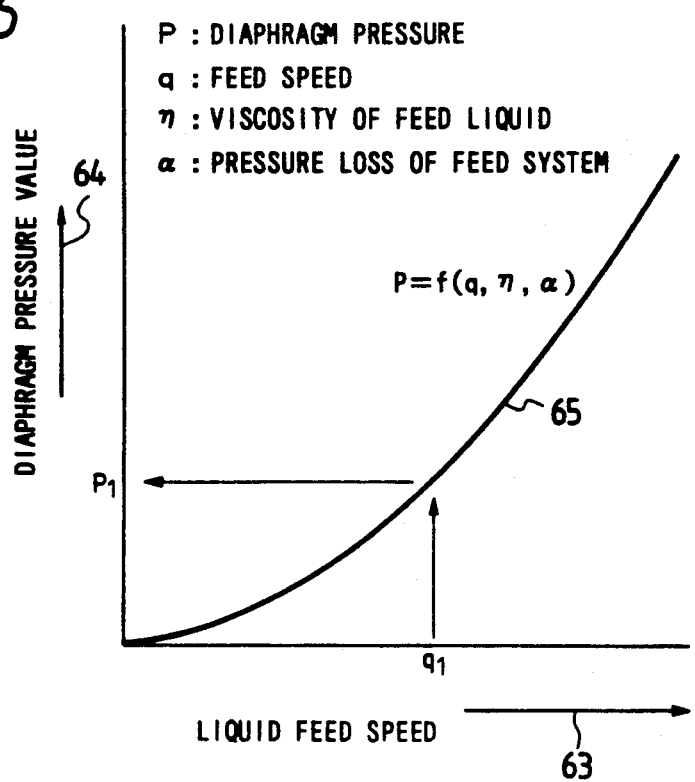
FIG. 6 is a graph of a diaphragm pressure—flow rate characteristic.

Now, as to an embodiment in which a liquid has its suction/discharge controlled precisely in a predetermined amount and at a predetermined speed, FIG. 5 shows a sectional view of the essential portions of a pump for automatically controlling a pressure on a diaphragm, and FIG. 6 shows a diagram of a diaphragm pressure—flow rate characteristic for the principle of the diaphragm pressure control.

The construction of this pump will be described with reference to FIG. 5. A pump body includes bodies 59 and 68 made of stainless steel, and a body 61 made of fluoroplastics. A diaphragm 46 made of fluoroplastics is set by the body 59, the body 61 and an O-ring 62.

The body 59 is formed with a suction/discharge amount controlling air circulation port 47, to which an electro-pneumatic servo proportional valve 32, a compressed air generator 33 and a vacuum generator 34 are connected. The body 61 is provided with a suction port 53 and a discharge port 55, to which a suction switching valve 3 and a discharge switching valve 6 are respectively connected.

The electro-pneumatic servo proportional valve 32, the suction switching valve 3 and the discharge switching valve 6 are connected to a pneumatic pressure control device 9. Further, the pneumatic pressure control device 9 is connected to a liquid-feed general-control device 11.

FIG. 6 represents the value 63 of the fluid feed speed on the axis of abscissas, and the value 64 of the diaphragm pressure on the axis of ordinates. For both the parameter values, there holds a diaphragm pressure characteristic formula 65 [$P=f(q.\eta.\alpha)$ where P is the diaphragm pressure, q is the feed speed value, $\eta$ is the viscosity value of a feed liquid, and $\alpha$ is the pressure loss value of a feed system].

Here, the operation of this embodiment will be described with reference to FIGS. 5 and 6.

The liquid-feed general-control device 11 determines the optimum value of a control pressure to act on a diaphragm displacement magnitude controlling chamber 48 and also determines the control conditions of the operating sequence of the electro-pneumatic servo proportional valve 32, suction switching valve 3 and discharge switching valve 6, in interlocking with input information items 10 on the constant-amount and constant-speed supply of the liquid, such as the viscosity, feed amount and feed speed of the feed liquid, and in conformity with the diaphragm pressure characteristic formula 65 [$P=f(q.\eta.\alpha)$].

On the basis of the control conditions, the liquid-feed general-control device 11 controls the electro-pneumatic servo proportional valve 32, suction switching valve 3 and discharge switching valve 6 through the pneumatic pressure control device 9.

The electro-pneumatic servo proportional valve 32 controls the operations of the compressed air generator 33 and the vacuum generator 34 and controls to the optimum the pressure value of the diaphragm displacement magnitude controlling chamber 48 determined by the liquid-feed general-control device 11. Thus, the suction speed value and suction amount of a suction liquid 52 to be imbibed into a liquid pressure feed chamber 49 are precisely controlled, while the discharge speed and discharge amount of a discharge liquid 54 to be spewed from the liquid pressure feed chamber 49 ar precisely controlled.

Figure 7:
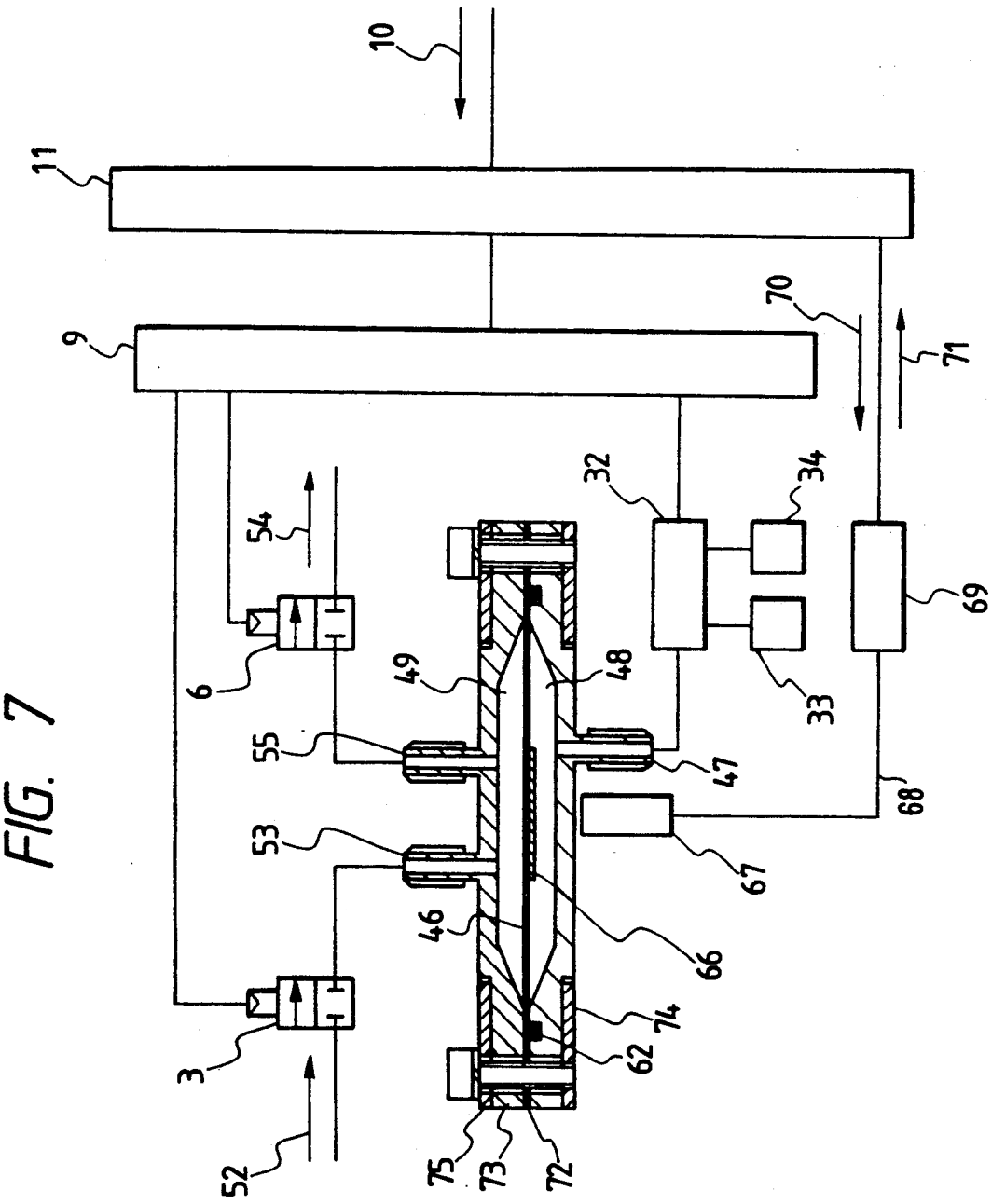
FIG. 7 is a view, partly in section, showing the essential portions of a pump for automatically measuring and controlling the displacement magnitude of the diaphragm.

FIG. 7 shows a sectional view of the essential portions of a pump for automatically measuring and controlling a diaphragm displacement magnitude. Unlike the diaphragm-pressure automatic control pump illustrated in FIG. 5, this system automatically measures the displacement magnitude of a diaphragm 46 and controls and corrects the value of a pneumatic pressure to act on a diaphragm displacement magnitude controlling chamber 48, in accordance with the measured result, thereby to precisely control the displacement speed of the diaphragm 46 to a predetermined one. Thus, it precisely controls the suction speed and suction amount of a suction liquid 52 to be imbibed into a liquid pressure feed chamber 49 or the discharge speed and discharge amount of a discharge liquid 54 to be spewed from the liquid pressure feed chamber 49.

Concretely, as an expedient for measuring the displacement magnitude of the diaphragm 46, this diaphragm 46 is provided with a diaphragm displacement magnitude measuring target 66 which is made of a conductor film such as Al film, and the position of the diaphragm displacement magnitude measuring target 66 is measured by a diaphragm displacement magnitude measuring unit 67 which includes a high-frequency oscillation type noncontacting displacement meter, thereby to measure the diaphragm displacement magnitude. The measured information 68 of the diaphragm displacement magnitude is transmitted to a diaphragm displacement magnitude comparing processor 69.

The diaphragm displacement magnitude comparing processor 69 compares the measured information 68 of the diaphragm displacement magnitude with the information 70 of a desired diaphragm displacement magnitude determined by a liquid-feed general-control device 11 in accordance with input information 10, and it determines the correction magnitude of the pressure of the diaphragm displacement magnitude controlling chamber 48 on the basis of the difference of the comparison and sends the liquid-feed general-control device 11 the pressure correction magnitude as pressure correction information 71. Using this information 71, the general control device 11 controls an electro-pneumatic servo proportional valve 32 through a pneumatic pressure control device 9. Thus, the Electro-pneumatic servo proportional valve 32 controls and corrects the pressure of the diaphragm displacement magnitude controlling chamber 48, thereby to precisely control the suction/discharge speed values and suction/discharge amounts into/from the liquid pressure feed chamber 49.

The diaphragm displacement magnitude measuring unit 67 utilizes the principle that, when the diaphragm displacement magnitude measuring target 66 made of the conductor material is brought near to a high-frequency coil within a magnetic field established by this coil, the inductance of the high-frequency coil is changed by eddy currents induced in the diaphragm displacement magnitude measuring target 66. Therefore, bodies 72 and 73 are made of fluoroplastics so as to render the attenuation of a magnetic force the smallest possible value.

Figure 8:
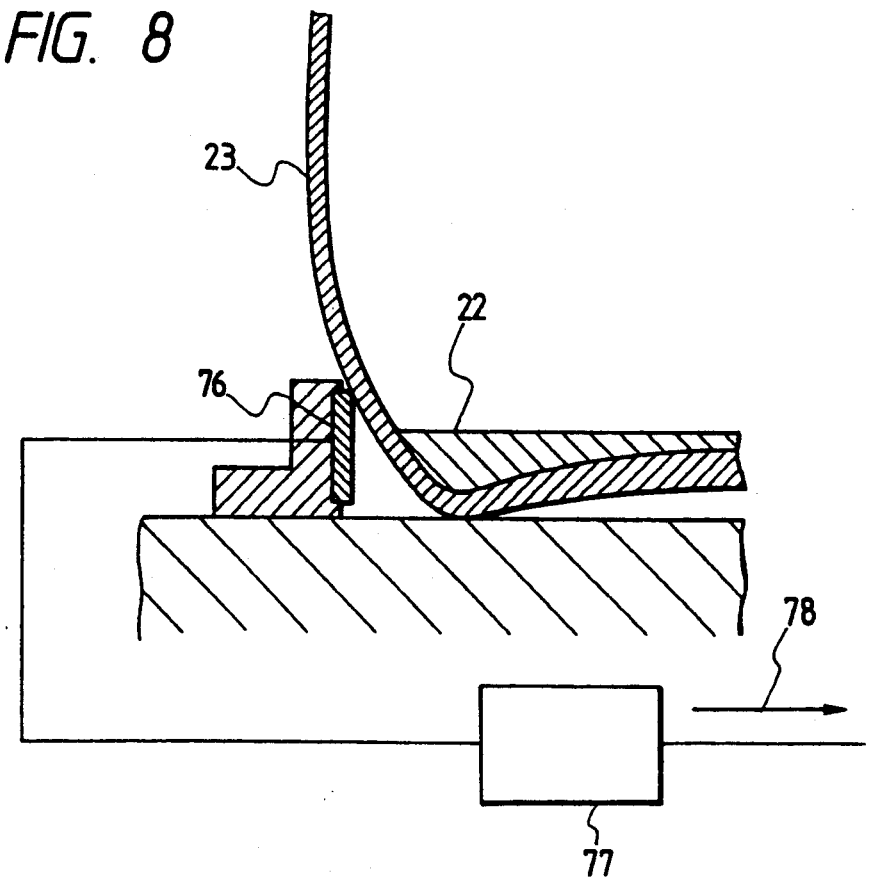
FIG. 8 is a sectional view of the essential portions of a liquid reserve sensing monitor.

FIG. 8 shows a sectional view of the essential portions of a liquid reserve sensing monitor.

In the construction of the reserve sensing monitor, an electrostatic capacity sensor 76 is employed as means for sensing the reserve liquid level of a photoresist solution 22 which is contained in a photoresist solution container 23 made of glass. The output information of the electrostatic capacity sensor 76 is transmitted to a reserve decision unit 77, which decides the reserve of the photoresist solution 22 in the photoresist solution container 23 and which delivers the decided reserve as reserve decision information 78.

Figure 9:
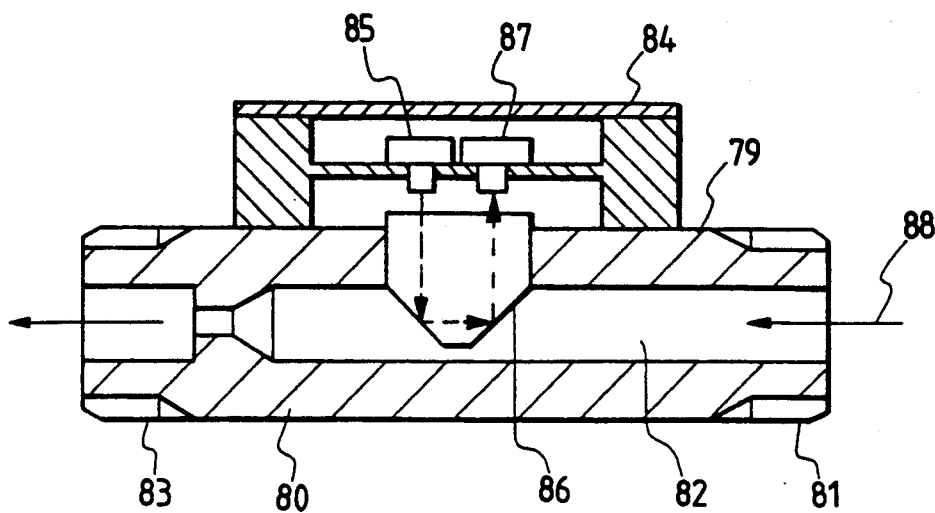
FIG. 9 is a sectional view of the essential portions of a valve damage sensing monitor.

FIG. 9 shows a sectional view Of the essential portions of a valve damage sensing monitor.

In the construction of the valve damage sensing monitor 79, a sensor body 80 includes an actuating valve joint 81, a leakage liquid trap portion 82 and an exhaust port joint 83, and it has a leakage liquid detector 84 connected thereto. The leakage liquid detector 84 includes a light projector 85, a prism lens 86 and a light receiver 87. When a valve damage leakage liquid 88 ascribable to the damage of a valve has been trapped in the leakage Liquid trap portion 82 and has touched the prism lens 86, light emitted from the light projector 85 fails to be received by the light receiver 87 because of the change of an optical path in which the light is reflected by the prism lens 86 and then received by the light receiver 87. Thus, the valve damage leakage liquid 88 is detected, with the result that the valve damage can be sensed.

Figure 10A:
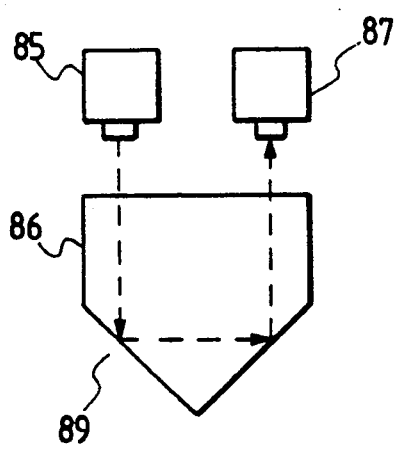
FIGS. 10(A) and 10(B) are diagrams for elucidating the principle of the valve damage sensing monitor.
Figure 10B:
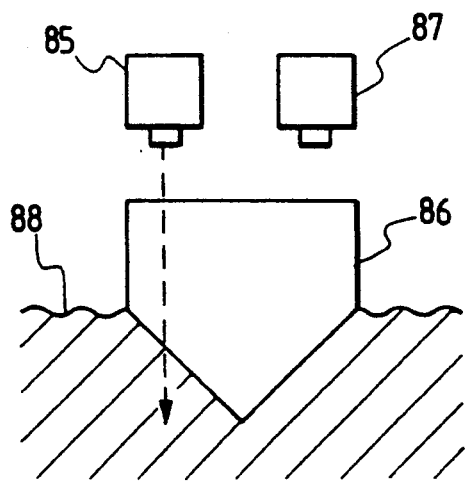

Diagrams for elucidating the principle of the valve damage sensing monitor are shown in FIGS. 10(A) and 10(B).

FIG. 10(A) corresponds to the absence of the valve damage leakage liquid 88 (situation A), and FIG. 10(B) the presence of the same 88 (situation B). Under the prism lens 86 in the situation A, the air 89 being the second medium is smaller in the refractive index than the prism lens 8 being the first medium. Besides, the incident angle of the projected light is greater than the critical angle thereof. In consequence, the light projected from the light projector 85 is totally reflected from the plane of the prism lens 86 and then reaches the light receiver 87.

On the other hand, under the prism lens 86 in the situation B, the valve damage leakage liquid 88 being the second medium is greater in the refractive index than the prism lens 86 being the first medium. Besides, the projected light is reflected very little. As a result, the light projected from the light projector 85 is transmitted through the prism lens 86 without being reflected and does not reach the light receiver 87.

The valve damage is sensed due to the difference between the situations A and B.

The valve damage sensing monitor 79 is common to the suction switching valve damage monitor 13, the diaphragm damage monitor 14, the discharge switching valve damage monitor 16, the suck-back valve damage monitor 17 and the air bubble vent switching valve damage monitor 30 described before.

Figure 11:
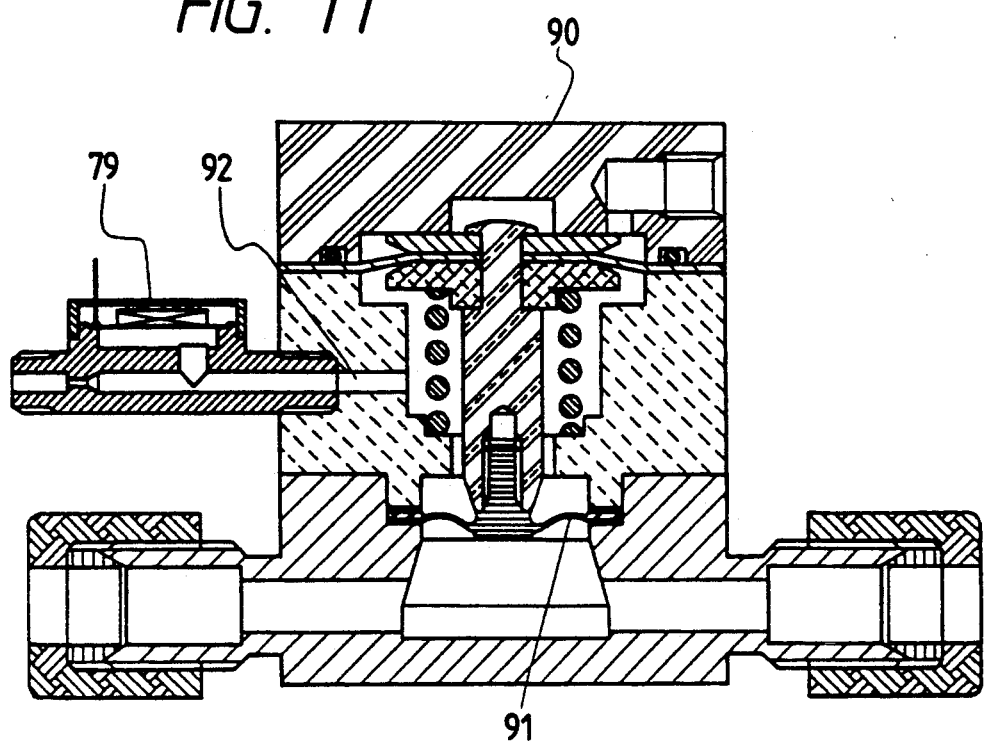
FIG. 11 is a view of the installation of the valve damage sensing monitor.

FIG. 11 shows a view of the installation of the valve damage sensing monitor. Here, the valve damage sensing monitor 79 is joined to a leakage port 92 into which the feed chemical liquid 1 leaks when a suck-back actuating valve 91 for a suck-back valve 90 is damaged.

When the suck-back actuating valve 91 is damaged, the damage is automatically sensed by the valve damage sensing monitor 79 in accordance with the valve damage sensing principle described with reference to FIG. 9 and FIGS. 10(A) and 10(B).

Figure 12:
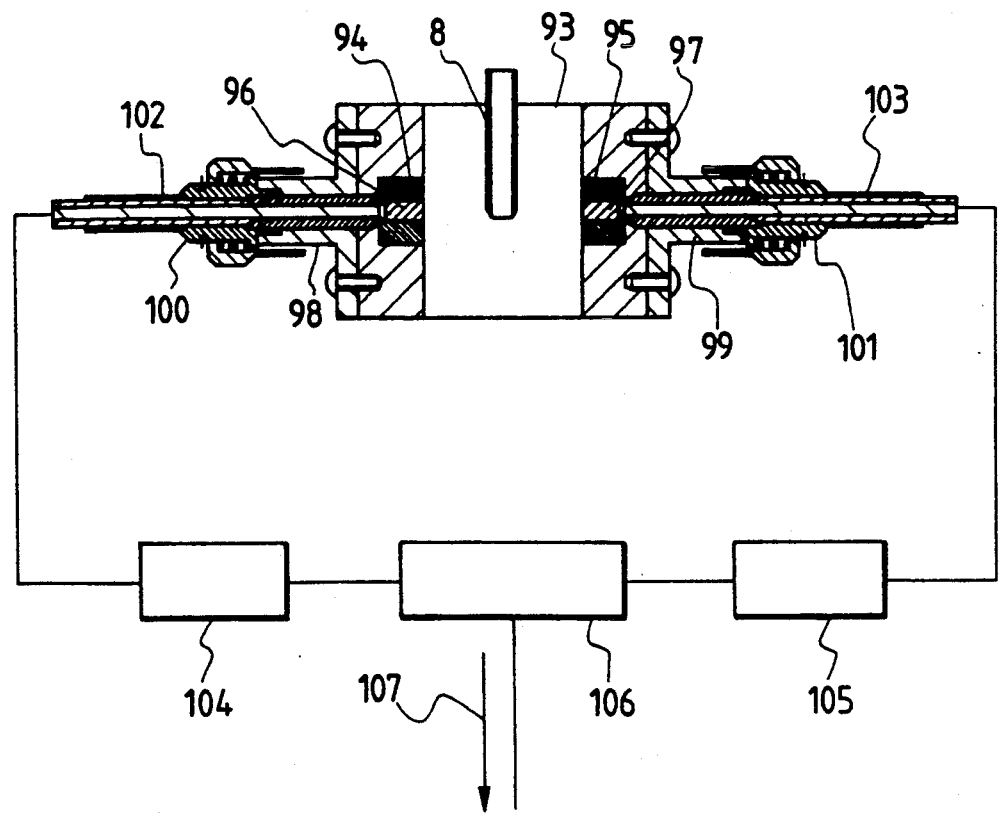
FIG. 12 is a sectional view of the essential portions of a monitor for sensing the contamination degree of a dropping nozzle.
Figure 13A:
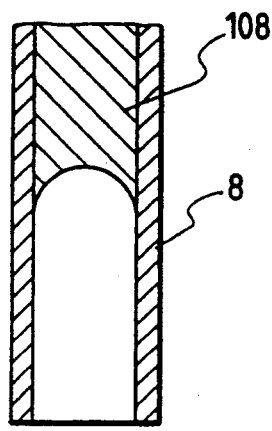
FIGS. 13(A) and 13(B) are views for explaining a dripping mechanism.
Figure 13B:
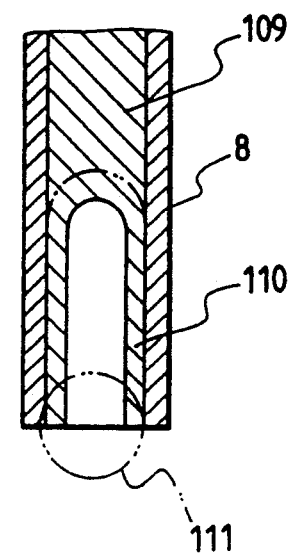
Figure 14:
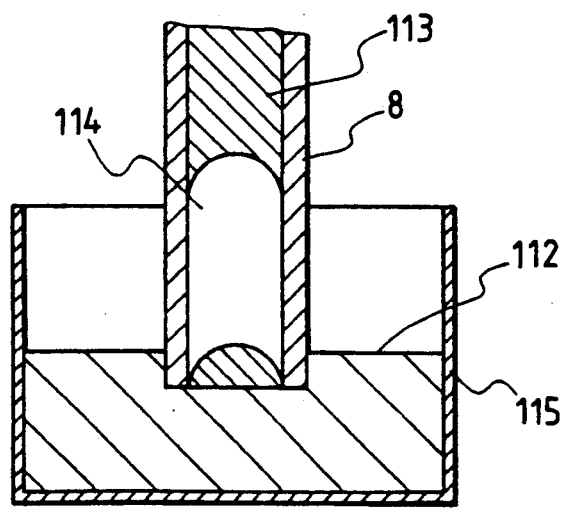
FIG. 14 is a sectional view of a portion for deterging the dropping nozzle.

FIG. 12 shows a sectional view of the essential portions of a dropping nozzle contamination sensing monitor.

In the construction of the dropping nozzle contamination sensing monitor, a monitor holder 93 is disposed with a dropping nozzle 8 held centrally, and lenses 96, 97 held by respective lens holders 94, 95 are mounted at positions opposing to each other. Glass fibers 102, 103 are respectively laid at the left and right by corresponding receptacles 98, 99 and corresponding connectors 100, 101.

A light projector 104 is connected to the glass fiber 102, while a light receiver 105 is connected to the glass fiber 103. Further, the light projector 104 and the light receiver 105 are connected to a nozzle contamination decision unit 106.

The principle of sensing the degree of contamination of the dropping nozzle 8 utilizes the fact that, when a predetermined quantity of light is projected on the dropping nozzle 8, a correlation exists between the contamination degree of the dropping nozzle 8 and the variation of the quantity of light transmitted through this dropping nozzle.

Concretely, a predetermined level of electric energy is applied from the nozzle contamination decision unit 106 to the light projector 104 so as to emit light in a predetermined amount, and collimated light is projected near the lower end of the dropping nozzle 8 by the glass fiber 102 as well as the lens 96. The resulting transmitted light is condensed by the lens 97, and then delivered to the light receiver 105 by the glass fiber 103.

Next, the operation of the contamination sensing monitor will be described with reference to FIGS. 2-12. The data input/output control unit 35 is fed with the items of input information 10 on the constant-amount and constant-speed supply of the photoresist solution 22, such as the viscosity, Discharge amount, discharge speed, suck-back amount, suck-back speed and filter pressure loss of the photoresist solution 22. On the basis of the input information items 10, the central processing unit 36 determines the optimum pressure value of the diaphragm pump 4 and suck-back valve 7 and the optimum operating sequence of the suction switching valve 3, diaphragm pump 4, discharge switching valve 6 and suck-back valve 7 for supplying the photoresist solution 22 in a constant amount and at a constant speed.

The electro-pneumatic servo proportional valve 32 is controlled by the determined control information items and through the diaphragm pressure control unit 37, and the pressures which act on the diaphragm actuating valves of the diaphragm pump 4 and suck-back valve 7 are controlled and optimized by the system illustrated in FIG. 5 or FIG. 7.

On the other hand, the pneumatic drive control valve 31 is controlled by the operating sequence control information items of the control elements and through the valve drive control unit 38, and the operations of the suction switching valve 3, diaphragm pump 4, discharge switching valve 6 and suck-back valve 7 are controlled and optimized.

Further, as an abnormality management expedient for preventing the occurrence of any abnormality and for preventing fluctuations in the constant-amount and constant-speed supply, the abnormality management signal processing unit 39 of the liquid-feed general-control device 11 manages the following abnormality management sensing monitors: The reserve sensing monitor 12 which senses the reserve of the photoresist solution 22 in the photoresist solution container 23; the suction Switching valve damage monitor 13, diaphragm damage monitor 14, discharge switching valve damage monitor 16, suck-back valve damage monitor 17 and air bubble vent switching valve damage monitor 30 which sense damage of the several actuating valves; the dropping nozzle contamination sensing monitor 18 which senses the contamination of the dropping nozzle 8 so as to prevent any matter adhering to the dropping nozzle 8 from mixing and dropping at the discharge of the photoresist solution 22; and the air bubble sensing monitor 15 which senses the air bubbles 56 trapped in the air bubble trap portion 25, in order to prevent the air bubbles 56 from mixing into the discharged photoresist solution 22.

When any of the various sensing monitors mentioned above has sensed the abnormality, the abnormality management signal processing unit 39 transmits the information of the abnormality to the central processing unit 36, which then controls the diaphragm pressure control unit 37 and valve drive control unit 38 in accordance with the abnormality information so as to control the various control elements.

By way of example, in the case where the reserve sensing monitor 12 has sensed the deficiency of the reserve, the photoresist solution 22 is automatically resupplied into the photoresist solution container 23. In the case where the air bubble sensing monitor 15 has sensed the air bubbles 56, the air bubble vent switching valve 27 is opened to discharge the air bubbles 56.

Further, in the case where any of the several actuating valves is damaged, the supply of the photoresist solution 22 is stopped, and an alarm signal is externally delivered from the data input/output control unit 35 as the output information 21.

In addition, in the diaphragm-pressure automatic control system illustrated in FIG. 5, the abnormality of the filter 26 can be managed by the electro-pneumatic servo proportional valve 32, diaphragm pressure control unit 37 and central processing unit 36. By way of example, in the operation of discharging the photoresist solution 22, the value of the pressure of the diaphragm displacement magnitude controlling chamber 48 at the time of the opening of the discharge switching valve 6 is sensed. When the pressure value is below a predetermined value, it is judged that the filter has been damaged, so the pressure loss of the filter has lowered. When the pressure value is above another predetermined value, it is automatically judged that the filter has become clogged, so the pressure loss has risen. In such a case, a filter abnormality alarm is delivered as the output information 21 from the data input/output control unit 35.

On the other hand, in the diaphragm-displacement-magnitude automatic measurement and control pump illustrated in FIG. 7, besides the above-stated function of monitoring the abnormality of the filter 26, the pressure of the diaphragm displacement magnitude controlling chamber 48 can be controlled and corrected by the diaphragm displacement magnitude comparison processing unit 69, the central processing unit 36 and diaphragm pressure control unit 37 of the liquid-feed general-control device 11, and the electro-pneumatic servo proportional valve 32 of the pneumatic pressure control device 9 so that the displacement speed (suction/discharge speed) of the diaphragm 46 may become predetermined values in correspondence with the pressure loss fluctuations of the filter 26.

Moreover, the viscosity of the photoresist solution 22 can be evaluated by the central processing unit 36 on the basis of the pressure value of the diaphragm displacement magnitude controlling chamber 48 and the displacement speed information value of the diaphragm 46 at the time of the opening of the discharge switching valve 6 and in conformity with a relational formula [$\eta = f(P.v.\alpha)$ where $\eta$ is the viscosity of the photoresist solution, P is the pressure value of the diaphragm displacement magnitude controlling chamber, v is the displacement speed of the diaphragm, and $\alpha$ is the pressure loss of the feed system].

The control parameters of the photoresist solution viscosity are controlled and corrected on the basis of the magnitude of the difference between the obtained value of the photoresist solution viscosity and the initial value thereof being the initial-condition input information 10, whereby the constant-amount and constant-speed suction/discharge control of the photoresist solution is precisely made.

Figure 15:
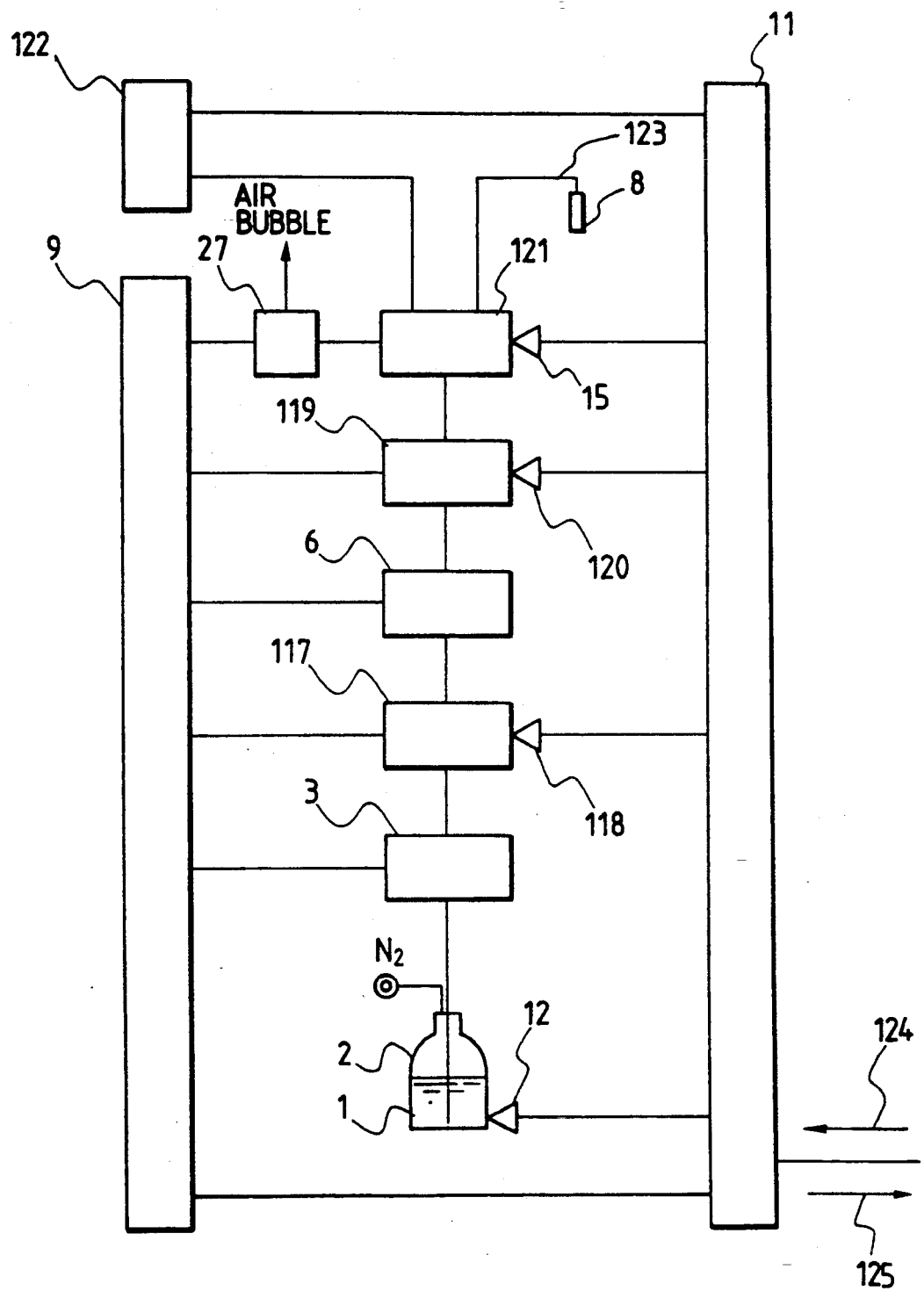
FIG. 15 is a system diagram of a chemical liquid feeding apparatus having a temperature control function.

Further, FIG. 15 shows an example of the application of an apparatus which feeds a chemical liquid in a clean state and under a precise temperature control.

This example is intended to combine the foregoing function of eliminating the air bubbles trapped in the filter, and the function of automatically measuring the pressure loss value of the filter and controlling and optimizing the operating speed value of the suck-back valve (the value of a pressure on the suck-back value) in accordance with the measured filter pressure loss value.

As a result, the air bubbles in the filter are removed to prevent the fluctuation of the suck-back amount due to the air bubbles, and also the fluctuation of the suck-back amount ascribable to the fluctuation of the filter pressure loss value due to the clogging of the filter and the change of the viscosity of the chemical liquid are prevented.

Due to this principle, even when a filter unit which stores the chemical liquid in a comparatively large quantity is constructed behind the pump and the suck-back valve, it is permitted to precisely control the discharge amount, discharge speed, suck-back amount and suck-back speed.

Further, the quantity of the liquid to be stored in that part of the feed system which is constructed behind the filter unit is set to be smaller than the quantity of discharge in a previous discharge disposal, whereby the chemical liquid can be fed in a constant amount and at a constant speed in a clean state and under precise,, temperature control.

Referring to FIG. 15, a mechanism for such purposes includes a chemical liquid container 2 which contains a chemical liquid 1, a reserve sensing monitor 12 which senses the reserve of the chemical liquid 1, a suction switching valve 3 which is opened and closed when the chemical liquid 1 is imbibed from the chemical liquid container 2, a diaphragm pump 117 which has the function of automatically measuring the displacement magnitude of a diaphragm, a noncontacting diaphragm displacement magnitude measurement unit 118 which measures the diaphragm displacement magnitude in a noncontacting manner, a discharge switching valve 6 which is opened and closed when the chemical liquid 1 is discharged, a diaphragm valve 119 which sucks back the chemical liquid 1 after the discharge thereof, a noncontacting diaphragm valve displacement magnitude measurement unit 120 which measures the displacement magnitude of the diaphragm valve 119 in a noncontacting manner, a filter with a temperature control function 121 which filters the feed chemical liquid 1 while controlling the temperature thereof, an air bubble sensing monitor 15 which automatically senses air bubbles trapped in the filter with the temperature control function 121, and an air bubble vent switching valve 27 which vents the air bubbles when they have been sensed by the air bubble sensing monitor 15.

Further, the example includes a temperature controller 122 which precisely controls the temperature of the filter with the temperature control function 121, a feed pipe 123 which feeds the chemical liquid filtered and subjected to the temperature control, and a dropping nozzle 8.

Meanwhile, the example includes a pneumatic pressure control device 9 which pneumatically controls the several drive valves, and a liquid-feed general-control device 11 which controls the pneumatic pressure control device 9, the sensing monitors and the displacement magnitude measuring units in integrated fashion in accordance with items of control input information 124 and which externally delivers control information items, e.g., alarm control information as items of control output information 125 as the results of the integrated control.

In operation, when initial conditions to be controlled, such as the temperature, discharge speed, discharge amount, suck-back speed and suck-back amount of the chemical liquid, are afforded as the control input information items 124 to the liquid-feed general-control device 11, this general control device 11 controls the pneumatic pressure control device 9 and the temperature controller 122.

Thus, the operations of the various constituents are controlled. Also, while the diaphragm displacement magnitude of the diaphragm pump with the diaphragm displacement magnitude measuring function 117 is being measured in the noncontacting manner by the noncontacting diaphragm displacement magnitude measurement unit 118, the value of a pressure acting on the diaphragm of the pump 117 is controlled and corrected by the pneumatic pressure control device 9 so that the diaphragm may be displaced at a predetermined speed.

Simultaneously, the switching timings of the suction switching valve 3 and the discharge switching valve 6 are controlled in combination, whereby the suction/discharge speeds and suction/discharge amounts of the chemical liquid are precisely controlled.

Furthermore, the temperature of the filter unit with the temperature control function 121 is precisely controlled to a predetermined temperature by the temperature controller 122. The storage quantity of the chemical liquid in the filter unit with the temperature control function 121 is set to a quantity in which the temperature of the chemical liquid stored in the filter unit is not changed by the temperature of the chemical liquid to be imbibed with the discharge thereof, whereby the temperature of the chemical liquid to be discharged can be precisely held.

Moreover, regarding the air bubbles trapped in the filter unit with the temperature control function 121, the liquid-feed general-control device 11 controls the pneumatic pressure control device 9 in response to the sensed information of the air bubble sensing monitor 15, and the control device 9 opens the air bubble vent switching valve 27 and actuates the diaphragm pump with the diaphragm displacement magnitude measuring function 117, whereby the air bubbles are excluded until the air bubble sensing monitor 15 comes to sense any air bubble. It is consequently possible to prevent the phenomena that the suck-back speed value, suck-back amount, discharge speed value and discharge amount of the chemical liquid fluctuate due to the air bubbles trapped in the filter unit with the temperature control function 121.

Furthermore, the quantity of storage of the chemical liquid in the feed pipe 123 and the dropping nozzle 8 which lie behind the filter unit with the temperature control function 121 is set to be smaller than the amount of discharge in the previous discharge disposal of the chemical liquid, the previous discharge function being performed by the liquid-feed general-control device 11, whereby the factors of the appearance of foreign matter, such as gelatinous foreign matter, attributed to the liquid staying in the feed system can be excluded.

As a result, the chemical liquid which is in a clean state and whose temperature is controlled with high accuracy can be fed in a constant amount and at a constant speed at all times.

Now, the photoresist solution feeding apparatus of a coating apparatus in another embodiment will be described.

Figure 16:
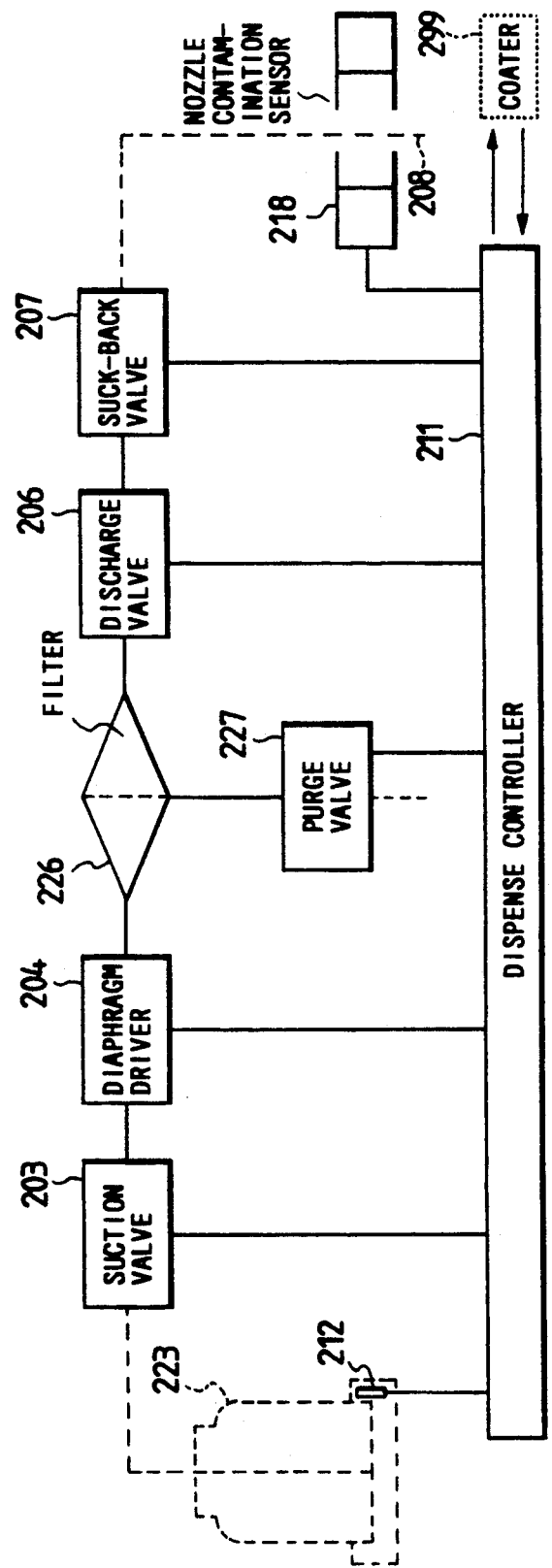
FIG. 16 is a block diagram of a photoresist dropping apparatus which is another embodiment of the present invention.
Figure 17:
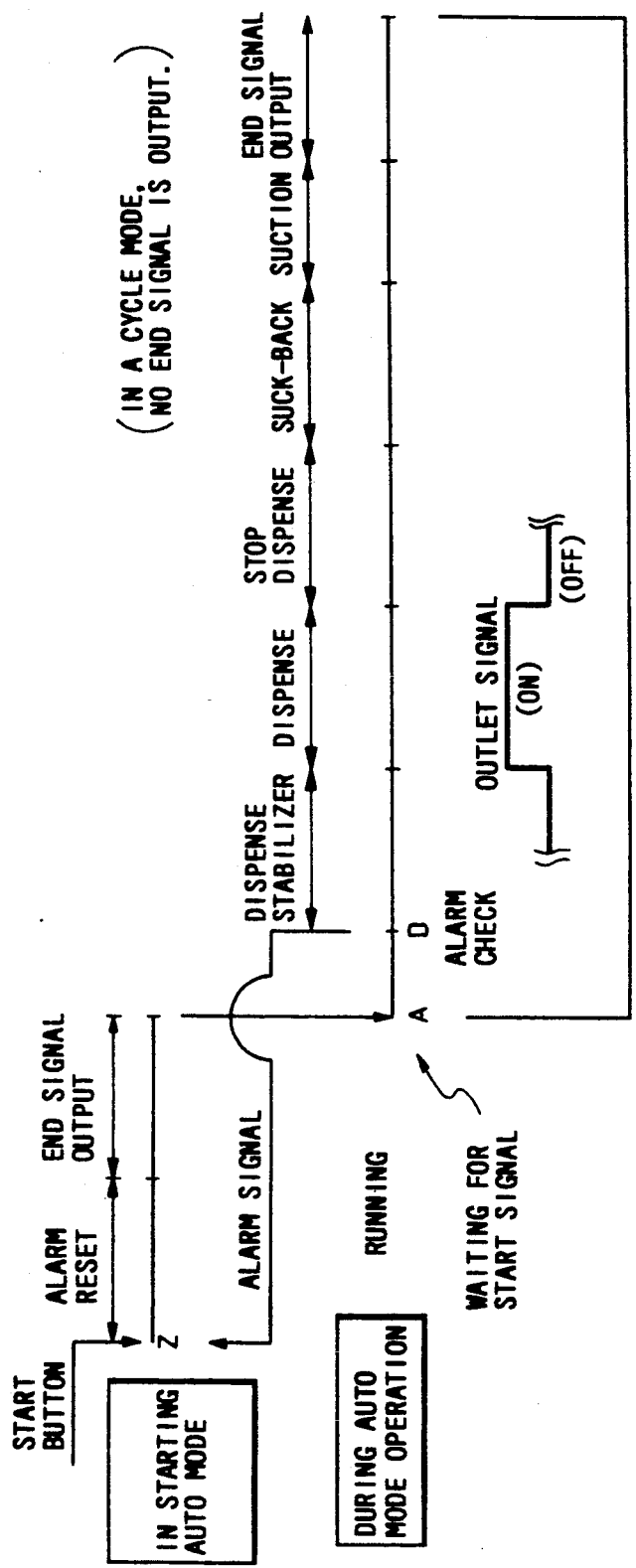
FIG. 17 is a diagram of one sequence of the apparatus in FIG. 16.

FIG. 16 and FIG. 17 are a system block diagram and a processing sequence diagram which correspond to the other embodiment, respectively.

Referring to FIG. 16, numeral 211 designates a dispense controller including a central control device which controls the whole system for feeding a coating liquid. Numeral 223 designates the source of the photoresist or SOG (Spin On Glass) coating liquid. A resist reserve monitor 212 automatically senses the reserve of the resist in the resist container 223. When the reserve has reached its limit, the monitor 212 supplies the data of this situation to the controller 211, and the controller 211 or the resist reserve monitor 212 itself generates an alarm signal so as to replace the resist container with a spare container.

A suction valve 203 includes a switching valve which forms a gate for the suction of the resist. A resist discharge pump 204 includes a diaphragm pump which discharges the resist solution from the suction valve 203 in a constant amount and at a constant speed by means of a pneumatic servo control mechanism. A filter 226 serves to remove impurities (granular foreign matter, air bubbles, and granulated resist components) contained in the resist solution or the like discharged from the discharge pump 204 (the filter is, for example, a filter cartridge manufactured by Nihon Millipore Ltd., Wafer Card F16D of F-4 having a pore diameter of 0.1 $\mu$m and a filtering area of 200 $cm^2$).

An air vent or air extraction valve 227 serves to eliminate air bubbles accumulated in the filter 226, and it is opened and closed in synchronism with a discharge valve to be mentioned below, thereby to remove the air bubbles.

The discharge valve 206 is a valve similar to the suction valve 203, and it operates as a gate for discharging the resist solution spewed from the discharge pump 204, onto a wafer put on a turntable. A suck-back pump or suck-back valve 207 sucks back the resist solution in a constant amount and at a constant speed by means of a pneumatic servo control mechanism, in order to prevent the undesirable dropping, namely, dripping of the resist solution from a discharge nozzle, and it drives a diaphragm valve pneumatically.

The servo mechanism of the diaphragm valve automatically controls a pressure on the diaphragm valve by means of an electro-pneumatic proportional valve (for example, Electro-Pneumatic Regulator ER-100 fabricated by CKD Inc.). The setting range of the suck-back amount is 0.001–0.05 cc, and that of a suck-back time is 0.1–10 sec.

The discharge nozzle 208 includes a tube made of PTFE (polytetrafluoroethylene) or the like. Numeral 218 indicates an optical impurity monitor for detecting the contaminations of the fore end of the nozzle 208, namely, the solid matter of the resist, air bubbles, other contaminative impurities, the abnormality of the resist liquid, etc. Shown at numeral 299 is a spin coater.

Here, the dispense controller 211 has the central control device including a microcomputer or minicomputer. It transfers data items and sends and receives command signals to and from the various devices (units) 212, 203, 204, 226, 227, 223, 206, 207, 218 and 299. More specifically, the dispense controller 211 initially sets a dispense time, a dispense amount, the suck-back time and the suck-back amount, and it controls the one-cycle operations of the various units on the basis of the set values. Simultaneously, it automatically supervises the abnormality management functions of the nozzle contamination monitor 218 and the resist reserve monitor 212, and it issues the alarm signal and immediately stops the operation of the feed system in case of any abnormality.

Next, the control modes of the dispense controller 211 will be described. A program mode is a mode for selecting the dispense amount, the suck-back amount, the suck-back time, etc., and it has the following input data items:

(1) Time for stabilizing a pump driving pressure 0–10.0 sec
(2) Dispense time 0.1–10 sec
(3) Time from a dispense operation to the start of a suck-back operation 0–10.0 sec
(4) Suck-back time 0.1–10 sec
(5) Suction time of the discharge pump 0.1–10.0 sec
(6) Dispense amount 0.1–5.0 cc
(7) Suck-back amount 0.001–0.050 cc
(8) Dispense amount offset +7.00 V
(9) Suck-back amount offset 0–2.4 V
(10) Viscosity 1–200 cp On the basis of the above input data items, the dispense controller 211 executes controls as follows:

(a) Regarding the dispense servo control, the pressure to act on the discharge pump unit is automatically determined and controlled in accordance with the input information items of the initial conditions. The error between the input data and an output is corrected by applying the proportion of the error as the offset voltage.

(b) Regarding the suck-back servo control, the pressure to act on the suck-back valve is automatically determined and controlled in accordance with the input information items of the initial conditions. The dispersion of the suck-back valve in fabrication is compensated by applying the offset voltage as a correction value.

(c) Regarding the nozzle contamination monitor control, the degree of contamination of the dropping nozzle portion is automatically detected, and when the nozzle contamination degree has exceeded a predetermined level, the dispense operation is interrupted and a nozzle contamination alarm signal is issued.

Referring now to FIG. 17, an auto mode and a cycle mode will the described. The cycle mode is such that the controller 211 repeats cycle operations by itself without communicating with the exterior, and it differs from the auto mode in only the point that an end signal is not generated. Therefore, the auto mode shall be chiefly explained here.

The communications between the dispense controller and the photoresist treatment equipment in FIG. 17 are as follows:

(1) Start signal generation timings:
(i) A start signal is sent from the side of the photoresist treatment equipment to the side of the dispense controller immediately before a disposal for previously discharging the resist.
(ii) A start signal is sent from the photoresist treatment equipment to the dispense controller immediately before the resist is dropped onto the wafer.

(2) Sense signal generation timing:
After the resist previous-discharge disposal, the nozzle is held stopped at the detecting position of the nozzle contamination sensor, and a sense signal is sent from the photoresist treatment equipment to the dispense controller.

(3) Dispense signal generation timings:
(i) As dispense signals, discharge valve switching (ON/OFF) signals are sent from the dispense controller side to the photoresist treatment equipment.
(ii) Upon receiving the dispense signals from the dispense controller, the photoresist treatment equipment decides the start and end of the dispense operation.

(4) End signal generation timing:
(i) After a dispense program has ended, the end signal is sent from the dispense controller to the photoresist treatment equipment.
(ii) Upon receiving the end signal from the dispense controller, the photoresist treatment equipment falls into a standby state in which it waits for a start signal.

(5) Alarm signal generation timings:
(i) When the nozzle is contaminated, an alarm signal is sent from the dispense controller to the photoresist treatment equipment.
(ii) When the reserve of the resist is deficient, an alarm signal is sent from the dispense controller to the photoresist treatment equipment.
(iii) When the alarm signal in Item (i) or (ii) has been generated, the dispense controller presents an alarm display, and the photoresist treatment equipment is immediately stopped upon receiving the alarm signal.

By the way, the respective gates, namely, the switching valves and the diaphragm pumps are furnished with monitors for sensing the damage of the diaphragms or valves, and data items on the abnormalities are transferred from the monitors to the central control device so as to manage the gates. Here, the "management" signifies to change-over the gate to a spare or bypass line as to the gate having the bypass and to shut down the system and generate an alarm signal as to the gate having no bypass.

Effects which are attained by typical aspects of performance of the present invention will be briefly explained below:

(1) According to the present invention, input information items on the constant-amount supply of a liquid, such as the viscosity, feed amount and feed time (feed speed) of the liquid to be fed, are interlocked with the pressure loss information items of a liquid feed system, so as to obtain the optimum solutions of the control parameters of the working pressure values, operation timings etc. of the constituents of the liquid feed system such as pumps and a suck-back valve, and the constituents are automatically controlled with the obtained control parameters, so that a precise feed-speed control and a precise feed-amount control can be made.

(2) Besides the above item (1), the present invention can automatically measure a liquid-feed pressure acting on each actuating valve and the moving speed of the actuating valve. The value of the feed pressure is controlled and corrected in accordance with the measured information of the moving speed of the actuating valve, whereby the moving speed of the actuating valve can be precisely controlled. As a result, the accuracy of the feed-speed control can be heightened.

(3) The feed actuating valve structure of the present invention utilizes the quantity of volumetric change which is based on the compression of a fluid employing a diaphragm. Accordingly, it involves no sliding resistance, exhibits a *favorable feed control response and achieves a minute control for the feed amount.

(4) The present invention has the function of controlling the factor of the appearance of air bubbles. By way of example, a monitor for the reserve of a liquid in a container is installed, no air bubble is mixed into the feed system by a deficient liquid reserve, and the operating speed of the pump actuating valve during liquid suction (during a negative pressure) can be controlled, so that the intra-liquid air bubbles can be prevented from appearing in the suction operation.

If air bubbles appear by any chance, they are detected by an air bubble sensing monitor, and they can be reliably removed through a control valve which can be ON/OFF-controlled independently.

As a result, mixing of the air bubbles into the liquid can be prevented, and the appearance of any intra-liquid foreign matter ascribable to the air bubbles and the fluctuations of the feed amount ascribable to the air bubbles can be synergetically prevented.

(5) According to the present invention, the individual constituents of the liquid feeding apparatus are furnished with monitors for detecting the factors of the appearance of foreign matter, such as a pump actuating valve damage monitor, a suck-back valve damage monitor, a control valve damage monitor, a filter membrane damage monitor and a dropping nozzle contamination monitor, and these monitors are managed and controlled by a general-control unit, so that foreign matter attributed to the constituents do not mix into the feed liquid.

(6) According to the present invention, the pump pressure can be precisely controlled to a predetermined value as understood from the above items (1) and (2). As a result, the liquid pressure acting on the filter membrane can be automatically controlled to or below a predetermined value, depending upon the kind of feed liquid, and any gelatinous foreign matter which would otherwise permeate the filter membrane due to the liquid pressure can be efficiently removed without permeation.

Further, the pressure loss of the filter which rises due to clogging of the filter membrane is automatically measured, and the liquid pressure acting on the filter membrane can be automatically controlled and corrected in accordance with the filter pressure loss, so that the removal efficiency of the filter can be heightened.

(7) According to the present invention, the suck-back speed and the suck-back amount can be precisely controlled to predetermined values as understood from the above items (1) and (2), so that the liquid can be supplied in a state of high purity without posing the problems of dripping of the liquid attributed to suck-back fluctuations, the deterioration of the liquid attributed to the remaining liquid in the dropping nozzle, and so on.

Further, the fluctuations of the feed amount attributed to the suck-back fluctuations can be prevented, and a precise liquid feed is realized.

(8) According to the present invention, as described in the above items (1)-(7), the conditions concerning the liquid feed, such as the viscosity, feed amount and feed time of the feed liquid, are input to the general control unit, whereby the individual constituents of the liquid feeding apparatus are automatically controlled depending upon the kind of the feed liquid, and the liquid can be precisely supplied at the predetermined speed, for the predetermined time and in the predetermined amount under high purity state under which the air bubbles, foreign matter etc. do not mix in the liquid.

That is, the complete automation of the liquid feed is achieved, and adjustments for changing-over the kinds of liquids or the feed amounts of the liquid can be made promptly and readily, thereby narrowing the dispersion of the adjustments, to shorten a period of time for the adjustments and to reduce the loss quantity of the liquid attendant upon the adjustments.

9) According to the present invention, as stated in the above item (2), the pressure of the liquid feed and the moving speed of the actuating valve can be measured, so that the viscosity of the feed liquid or the pressure loss of the feed system can be automatically evaluated.

Moreover, since the pressure and the moving speed can be measured in a noncontacting manner, namely, without touching the feed liquid, they can be precisely measured without contaminating the feed liquid.

(10) The present invention has the function of automatically monitoring the contamination degree of the feed liquid dropping nozzle, and this function can be joined with the function of automatically deterging or automatically exchanging the dropping nozzle in accordance with the contamination degree of the dropping nozzle, so that the dropping nozzle can be always held clean, and the mixing of foreign matter into the feed liquid attendant upon the contamination of the dropping nozzle does not occur at all.

(11) As the effect of the present invention, a liquid of high purity having a small amount of mixed foreign matter can be supplied precisely at a constant speed and in a constant amount. Therefore, when the present invention is applied to equipment for producing semiconductor wafers, the amount of foreign matter adhering to the semiconductor wafer is small, and a semiconductor device of high quality can be manufactured

(12) According to the present invention, a filter unit with a temperature control function can be arranged behind those constituent components of the chemical liquid feeding apparatus which have the factors of the appearance of any gelatinous foreign matter and the factors of the appearance of air bubbles ascribable to the staying of the liquid, such as the pump, the suck-back valve and the several switching valves.

Moreover, the quantity of the liquid to stay in the part of piping behind the filter unit is set to be smaller than the quantity of the liquid in a previous discharge disposal, and in the normal operation of feeding the chemical liquid, the chemical liquid whose temperature has been adjusted by the filter unit with the temperature control function and which has been subjected to filtering by the same is directly supplied.

That is, the chemical liquid whose temperature has been precisely adjusted can be always supplied in a constant amount and at a constant speed under a clean state.

In the above, the invention made by the inventors has been briefly described as to a photoresist treatment apparatus in a semiconductor wafer processing equipment as is the field of utilization forming the background of the invention. However, the present invention is not restricted to the apparatus, but it is effective when applied to treatment apparatus in which liquids are to be supplied at constant speeds and in constant amounts with high purities and high accuracies, in analytical systems and in chemical industries, pharmaceutical industries, biotechnological industries, optics industries, precision machine industries, etc., such as a resin coating apparatus disclosed in the official gazette of Japanese Patent Application Laid-open No.

48160/1979, a first glass coating apparatus for color cathode-ray tubes as disclosed in the official gazette of Japanese Patent Application Laid-open No. 177365/1982, a multipotting apparatus disclosed in the official gazette of Japanese Patent Application Laid-open No. 177570/ 1982, and a dispenser for bonding electronic components as disclosed in the official gazette of Japanese Patent Application Laid-open No. 95977/1985.

We claim:

1. An apparatus for spin-coating a flat object with a viscous coating liquid, comprising:
   (a) dispenser means having a diaphragm pump for sucking the coating liquid from a liquid source and for discharging and dropping the sucked liquid in a constant amount and at a constant speed from a discharge nozzle onto the flat object placed on a rotary stage;
   (b) a dispenser central control device including a microcomputer or minicomputer for controlling said diaphragm pump; and
   (c) diaphragm displacement detection means for detecting at least one of a position and displacement speed of a diaphragm of said diaphragm pump in a noncontacting manner, and for delivering data of the at least one of the position and displacement speed to said central control device.

2. A coating apparatus according to claim 1, further comprising:
   (d) viscosity measurement means for measuring a viscosity of said coating liquid, and for delivering data of the viscosity to said central control device.

3. A coating apparatus according to claim 1, further comprising:
   (e) foreign matter detection means for detecting foreign matter contained in said coating liquid within said dispenser means, and for delivering data of the foreign matter to said central control device.

4. A coating apparatus according to claim 1, further comprising:
   (f) said diaphragm pump having a coating liquid suction valve or discharge valve provided independently of a diaphragm drive section, said diaphragm drive further includes a liquid pressure feed chamber and a pressure chamber.

5. A coating apparatus according to claim 4, further comprising:
   (g) filter means interposed between said diaphragm pump and said suction or discharge valve, for removing any foreign matter contained in said coating liquid.

6. A coating apparatus according to claim 5, further comprising:
   feed pressure detection means for detecting a pressure of said pressure feed chamber of said diaphragm pump;
   wherein said central control device calculates an optimum feed pressure from the diaphragm displacement speed data and data of the feed pressure so as to control the feed pressure.

7. A coating apparatus according to claim 1, further comprising:
   (i) valve or diaphragm damage detection means for detecting any damage of a valve or diaphragm provided in said dispenser means, and for delivering data of the damage to said central control device.

8. coating apparatus according to claim 1, further comprising:
   (i) gas bubble trap means provided in said dispenser means, for trapping gas bubbles contained in said coating liquid.

9. A coating apparatus according to claim 8, further comprising:
   (k) gas bubble detection means for detecting presence or an amount of the gas bubbles trapped in said gas bubble trap means, and for delivering data of the presence or amount to said central control device.

10. A coating apparatus according to claim 9, further comprising:
    (l) gas bubble exclusion means for excluding the air bubbles on the basis of said data from said air bubble detection means.

11. A coating apparatus according to claim 6, wherein said central control device manages an upper limit or lower limit of a pressure loss ascribable to said filter means, on the basis of data items of the diaphragm displacement speed and the feed pressure.

12. A coating apparatus according to claim 5, further comprising:
    (m) filter temperature control means for controlling a temperature of said coating liquid in said filter means.

13. A coating apparatus according to claim 12, wherein said filter temperature control means is controlled by said central control device.

14. A coating apparatus according to claim 12, wherein an amount of said coating liquid to be stored behind said filter mean is set to be smaller than an amount of discharge in a previous discharge disposal for discharging and eliminating at an initial stage of operation the coating liquid which has accumulated on a discharge nozzle side and which might have deteriorated.

15. A coating apparatus according to claim 14, further comprising:
    (n) suck-back valve means for preventing said coating liquid from undesirably dropping out of the discharge nozzle which is provided on a suction side with respect to said filter means, within a suction and discharge path for said coating liquid.

16. An apparatus for spin-coating a flat object with a viscous liquid comprising:
    (a) dispenser means having suck-back means including a diaphragm pump by which, in sucking the coating liquid from a liquid source and then dropping the coating liquid from a discharge nozzle onto the flat object placed on a rotary stage, the coating liquid within said discharge nozzle is sucked inwardly of said nozzle in a constant amount and at a constant speed after each preceding drop in order to prevent any undesirable drop;
    (b) a dispenser central control device including a microcomputer and minicomputer for controlling said suck-back means; and
    (c) diaphragm displacement detection means for detecting at least one of a position and displacement speed of a diaphragm of said diaphragm pump of said suck-back means in a noncontacting manner, and for delivering data of at least one of the position and displacement speed to said central control device.

17. A coating apparatus according to claim 16, further comprising:

(d) viscosity measurement means for measuring a viscosity of said coating liquid, and for delivering data of the viscosity to said central control device.

18. A coating apparatus according to claim 16, further comprising:
   (e) foreign matter detection means for detecting foreign matter contained in said coating liquid within said dispenser means, and for delivering data of the foreign matter to said central control device.

19. A coating apparatus according to claim 16, further comprising:
   (f) diaphragm damage detection means for detecting damage of a diaphragm provided in said suck-back means, and for delivering data of the damage to said central control device.

20. A coating apparatus according to claim 16, further comprising:
   (g) gas bubble trap means provided in said dispenser means, for trapping gas bubbles contained in said coating liquid.

21. A coating apparatus according to claim. 20, further comprising:
   (h) gas bubble detection means for detecting a presence or an amount of the gas bubbles trapped in said gas bubble trap means, and for delivering data of the presence or amount to said central control device.

22. A coating apparatus according to claim 21, further comprising:
   (i) gas bubble exclusion means for excluding the gas bubbles on the basis of said data from said gas bubble detection means.

23. An apparatus for spin-coating a flat object with a viscous coating liquid, comprising:
   (a) dispenser means having a diaphragm pump for sucking the coating liquid from a liquid source and for discharging and dropping the sucked liquid in a constant amount and at a constant speed from a discharge nozzle onto the flat object placed on a rotary stage; and
   (b) a dispenser central control device including a microcomputer or minicomputer for controlling said diaphragm pump;
   (c) diaphragm displacement detection means for detecting at least one of a position and displacement speed of a diaphragm of said diaphragm pump in a noncontacting manner, and for delivering data of the at least one of the position and displacement speed to said central control device;
   (d) viscosity measurement means for measuring a viscosity of said coating liquid, and for delivering data of the viscosity to said central control device;
   (e) foreign matter detection means for detecting foreign matter contained in said coating liquid within said dispenser means, and for delivering data of the foreign matter to said central control device;
   (f) said diaphragm pump having a coating liquid suction valve or discharge valve provided independently of a diaphragm drive section, said diaphragm drive further includes a liquid pressure feed chamber and a pressure chamber;
   (g) filter means interposed between said diaphragm pump and said suction or discharge valve, for removing foreign matter contained in said coating liquid;
   (h) feed pressure detection means for detecting a pressure of said pressure feed chamber of said diaphragm pump;
   wherein said central control device calculates an optimum feed pressure from the diaphragm displacement data and data of the feed pressure so as to control the feed pressure;
   (i) valve or diaphragm damage detection means for detecting damage of a valve or diaphragm provided in said dispenser means, and for delivering data of the damage to said central control device; and
   (j) gas bubble trap means provided in said dispenser means, for trapping gas bubbles contained in said coating liquid.

* * * * *